(12) United States Patent
Bloomstein et al.

(10) Patent No.: US 6,833,234 B1
(45) Date of Patent: Dec. 21, 2004

(54) STEREOLITHOGRAPHIC PATTERNING WITH VARIABLE SIZE EXPOSURE AREAS

(75) Inventors: Theodore M. Bloomstein, Brookline, MA (US); Roderick R. Kunz, Acton, MA (US); Stephen T. Palmacci, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 160 days.

(21) Appl. No.: 09/922,973

(22) Filed: Aug. 6, 2001

Related U.S. Application Data
(60) Provisional application No. 60/223,067, filed on Aug. 4, 2000.

(51) Int. Cl.$^7$ .............................. G03F 7/00; B29C 35/00
(52) U.S. Cl. ....................... 430/321; 430/311; 430/320; 700/119; 700/120; 700/121; 264/401
(58) Field of Search ......................... 430/311–312, 320; 430/322; 264/401; 700/117–120

(56) References Cited

U.S. PATENT DOCUMENTS

| | | | |
|---|---|---|---|
| 4,575,330 A | | 3/1986 | Hull ........................... 425/174 |
| 5,182,056 A | * | 1/1993 | Spence et al. ............... 264/401 |
| 5,496,683 A | * | 3/1996 | Asano ......................... 430/322 |
| 5,623,473 A | * | 4/1997 | Ichihara ...................... 430/321 |
| 5,753,171 A | * | 5/1998 | Serbin et al. ................ 264/401 |
| 6,406,658 B1 | * | 6/2002 | Manners et al. ............ 264/401 |

OTHER PUBLICATIONS

J.M. Moran and D. Maydan, "High Resolution, Steep Profile Resist Patterns," *J. Vac. Sci. Technol.* 16(6):1620–1624(1979).
M. Hatzakis, "PMMA Copolymers as High Sensitivity Electron Resists," *J. Vac. Sci. Technol.*, 16(6):1984–1988(1979).
C.W. Wilkins, Jr., E. Reichmanis, T.M. Wolf, and B.C. Smith, "An Orgnosilicon Novolac Resin for Multilevel Resist Applications," *J. Vac. Sci. Technol.* B 3(1):306–309(1985).
L.F. Halle, "A Water Soluble Contrast Enhancement Layer," *J. Vac. Sci. Technol.* B 3(1):323–326 (Jan./Feb. 1985).
E.K. Pavelchek, V.B. Valenty, and R.E. Williams, Jr., "Application of a Contrast Enhancement Material to Broadband Projection Printing," *SPIE* 538:78–85(1985).
P.R. West, G.C. Davis, and B.F. Griffing, "Contrast Enhanced Photolithography: Application of Photobleaching Processes in Microlithography," *J. of Imag. Sci.* 30(2):65–68(Mar./Apr. 1986).
A.W. McCullough, D.A. Vidusek, M.W. Legenza, M. De Grandpre, and J. Imhof, "Polydimethylglutarimide (PMGI) Resist—A Progress Report", *SPIE* 631:316–320(1986).
M.J. Rooks, S. Wind, P. McEuen, and D.E. Prober, "Fabrication of 30–nm–scale Structures for Electron Transport Studies Using a Polymethylmethacrylate Bilayer Resist," *J. Vac. Sci. Technol.* B 5:318–321(1987).
B.F. Hafner, "Optical Pattern Generator Using Excimer Laser," *SPIE* 922: 417–423(1988).

(List continued on next page.)

*Primary Examiner*—Mark F. Huff
*Assistant Examiner*—Kripa Sagar
(74) *Attorney, Agent, or Firm*—Thomas J. Engellenner; Kevin M. Cronin; Nutter McClennen & Fish LLP

(57) ABSTRACT

Methods for the preparation of multilayered resists are described. To efficiently pattern large contiguous areas rapidly, a procedure has been developed using spot-size modulation of the focused laser beam to more efficiently pattern interior portions. Critical portions at the perimeter are patterned at high resolutions. The spot-size is progressively increased towards the interior allowing a controlled transition to coarser spot-sizes without impacting the exposure dose in critical portions. Patterning times are significantly reduced since in effect shells are patterned. An algorithm is defined to subdivide a layer into different zones, determine the appropriate focused spot-sizes used for each zone, and define the laser scan trace within a zone to enable efficient patterning of broad areas in positive tone resists.

25 Claims, 19 Drawing Sheets

OTHER PUBLICATIONS

W. Brurnsvold, C. Lyons, W. Conley, D. Crockatt, M. Skinner, and A. Uptmor, "Advanced Bilayer resist Process with Optimized PMGI Formulation," *SPIE* 1086:289–299 (1989).

T. Tanaka, N. Hasegawa, H. Shiraiashi, and S. Okazaki, "A New Photolithography Technique with Antireflective Coating on Resist: ARCOR," *J. Electrochem. Soc.* 137(12):3900–3904 (1990).

M. Sebald, J. Berthold, M. Beyer, R. Leuschner, CH. Nolsher, U. Scheler, R. Sezi, H. Ahne, and S. Birkle, "Application of the Si–CARL Bilayer Process," *SPIE* 1466:227–237(1991).

C.F. Lyons, R.K. Leidy, and G.B. Smith, "Practicing the Top Antireflector Process," *SPIE* 1674:523–531(1992).

M. Gehm, P. Jaenen, V.V. Driessche, A.–M. Goethals, N. Samarakone, L.V. Den Hove, B. Denturck, "Evaluation of Methods to Reduce Linewidth Variation Due to Topography for I–line and Deep UV Lithography," *SPIE* 1674:681–700(1992).

A.B. Frazier and M.G. Allen, "Metallic Microstructures Fabricated Using Photosensitive Polyimide Electroplating Molds," *J. of Microelectromechanical Systems* 2(2):87–94(1993).

H. Guckel, K.J. Skrobis, J. Kelin, and T.R. Christenson, "Micromechanics Via X–ray Assisted Processing," *J. Vac. Sci. Technol. A* 12(4):2559–2564(1994).

B. Lochel, A. Maciossek, M. Konig, H.J. Quenzer, and H.–L. Huber, "Galvanoplated 3D Structures for Micro Systems," *Microelectronic Engineering* 23:455–459(1994).

B. Lochel, A. Maciossek, M. Rothe, and W. Windbracke, "Microcoils Fabricated by UV Depth Lithography and Galvanoplating," *Sensors and Actuators A* 54:663–668(1996).

K. Ikuta, K. Hirowatari, T. Ogata, "Three Dimensional Micro Integrated Fluid Systems (MIFS) Fabricated by Stereo Lithography," *Proceedings IEEE Micro Electro Mechanical Systems. An Investigation of Micro Structures, Sensors, Actuators, Machines and Robotic Systems (Cat. No. 94CH3404–1)* (IEEE, New York, NY, USA; 1994), pp. 1.

H. Lorenz, L. Paratte, R. Luthier, N. F. De Rooij and P. Renuad, "Low–cost Technology for Multilayer Electroplated Parts Using Laminated Dry Film Resist," *8th International Conference on Solid–State Sensors and Actuators and Eurosensors IX Digest of Technical Papers (IEEE Cat. No. 95TH8173)* (Found. Sensors & Actuator Techol, Stockholm, Sweden; 1995) pp. 143.

S. Massoud–Ansari, P.S. Mangat, J. Klein, H. Guckel, "A multi–level, LIGA–like Process for Three Dimensional Actuators," *The Ninth Annual International Workshop on Micro Electro Mechanical Systems. An Investigation of Micro Structures, Sensors, and Actuators, Machines and Systems (Cat. No. 96CH35856)*, (IEEE, New York, NY, USA; 1996), pp. 285.

O. Vladimirsky, G. Calderon, Y. Vladimirsky, and H. Manohara, "Thick PMMA Layer Formation as an X–ray Imaging Medium for Micromachining," *SPIE* 2723:360–371(1996).

U. Schaedeli, E. Tinguely, A.J. Blakeney, P. Falcigno, and R.R. Kunz, "Bilayer Resist Approach for 193–nm Lithography," *SPIE* 2724:344–354(1996).

E.K. Pavelchek, J.D. Meador, D.J. Guerrero, J.E. Lamb III, A. Kache, M. Docanto, T.G. Adarns, D. Stark, and D. Miller, "A Highly Absorbing ARC for DUV Lithography," *SPIE* 2724:692–699(1996).

G. Calderon, K. Moms, O. Vladimirsky, and Y. Vladimirsky, "Multi–level 3–D Patterning of Stacked PMMA Sheets for X–ray Microlithography," *SPIE* 2880:231–235(1996).

S. Maruo, O Nakamura, and S. Kawata, "Three–dimensional Microfabrication with Two–photon–absorbed Photopolymerization," *Optics Letters* 22(2):132–134(1997).

K. Ikuta, S. Maruo, and S. Kojima, "New Micro Stereo Lithography for Freely Movable 3D Micro Structure—Super IH Process with Submicron Resolution," *IEEE Eleventh Annual International Workshop on Micro Electro Mechanical Systems. An Investigation of Micro Structures, Sensors, Actuators, Machines and Systems (Cat. No. 98CH36176)* (IEEE, New York, NY, USA; 1998), pp. 290.

A. Bertsch, H. Lorenz, and P. Renaud, "Combining Mircostereolithography and Thick Resist UV Lithography for 3D Microfabrication," *IEEE Eleventh Annual International Workshop on Micro Electro Mechanical Systems. An Investigation of Micro Structures, Sensors, Actuators, Machines and Systems (Cat. No 98CH36176)* (IEEE, New York, NY, USA; 1998), pp. 18.

B.H. Cumpston, J.E. Ehrlich, S.M. Kuebler, M. Lipson, S.R. Marder, D. McCord–Maughton, J. W. Perry, H. Rockel, and M. Rumi, "Three–dimensional Microfabrication Using Two–photon Polymerization," *SPIE* 3512:168(1998).

M.P. Joshi, H.E. Pudavar, J. Swiatkiewicz, and P.N. Prasad, "Three–dimensional Optical Circuitry Using Two–photon–assisted Polymerization," *Appl. Phys. Lett.* 74(2):170–172(1999).

S.M. Kuebler, M. Rumi, T. Watanabe, K. Braun, B.H. Cumpston, A.A. Heikal, L.L. Erskine, S. Thayumanavan, S. Barlow, S.R. Marder, J.W. Perry, "Optimizing Two–photon Initiators and Exposure Conditions for Three–dimensional Lithographic Microfabrication," *J. of Photopolymer Sci. and Tech.* 14(4):657–668(2001).

Kilie A. Robert, Michael B. Thompson "Finer Features for Functional Microdevices," *Nature* vol. 412:697–698(2001).

Gale et al. "Fabrication of Continuous–relief micro–optical elements by direct laser writing in photoresists" *Optical Engineering*, vol. 33, No. 11, pp. 3556–3566 (1994).

Chen et al. "Predicting total build–time and the resultant cure depth of the 3D stereolithography process" *Rapid Prototyping Journal*, vol. 2, No. 4, pp. 27–40 (1996).

* cited by examiner

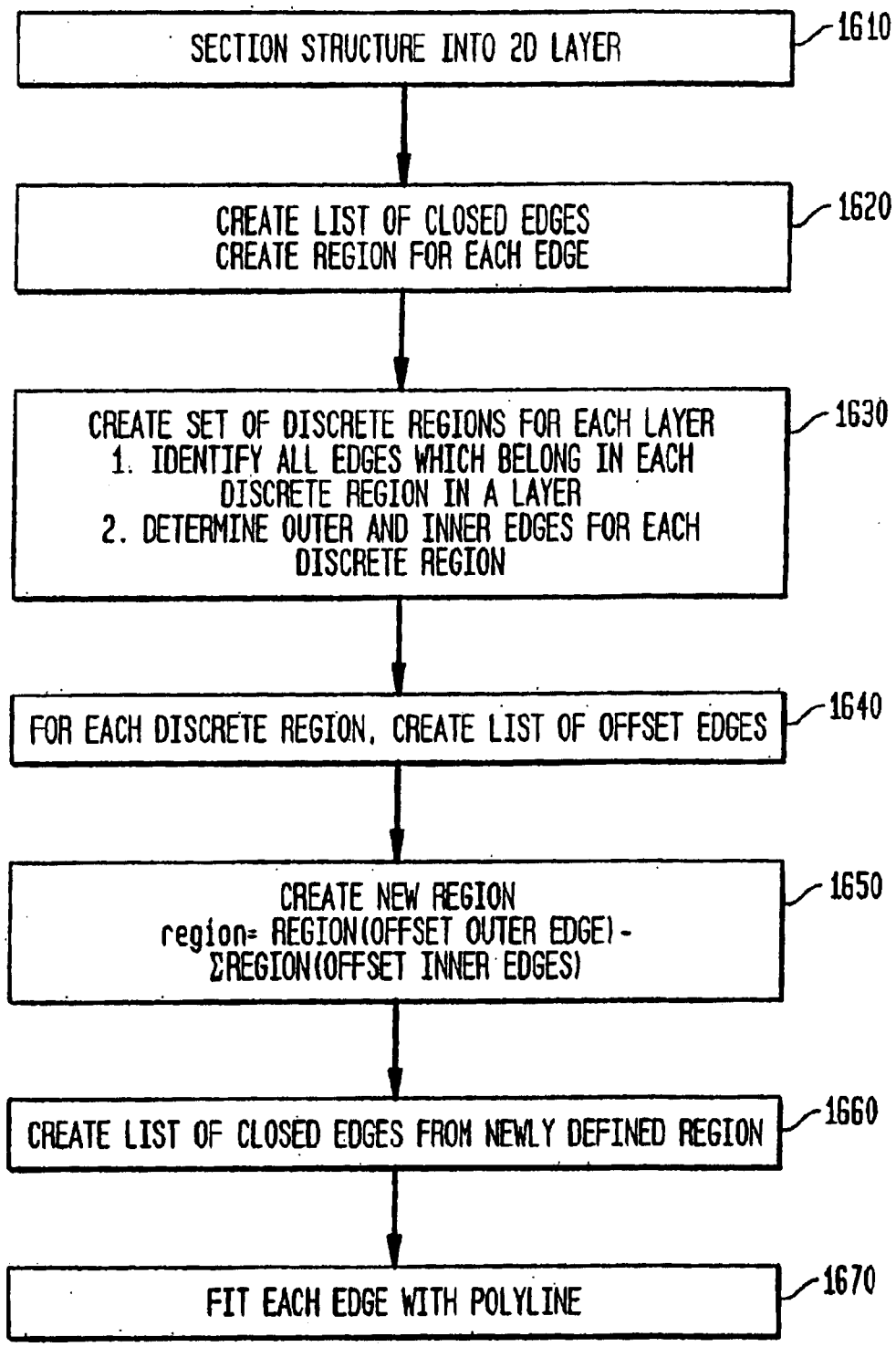

STEREOLITHOGRAPHIC PATTERNING WITH VARIABLE SIZE EXPOSURE AREAS

CROSS-REFERENCE TO RELATED APPLICATIONS

This application claims priority from and expressly incorporates herein by reference U.S. Provisional Patent Application No. 60/223,067, filed Aug. 4, 2000 entitled "High Resolution Stereolithographic Patterning in Integrated Circuit Compatible Photoresists."

STATEMENT REGARDING FEDERALLY SPONSORED RESEARCH

This invention was made with U.S. government support under Contract No. F19628-95-C-0002 awarded by the Department of the United States Air Force. The U.S. government has certain rights in the invention as a result of such support.

BACKGROUND OF THE INVENTION

The technical field of the invention is photolithography and, in particular, stereolithographic patterning of materials.

Stereolithographic patterning enables rapid prototyping of complicated three-dimensional structures. Parts are built up in a layer by layer manner typically from 3D computer representations with no tooling or mounting changes during the build operation. Until recently, most techniques concentrated on fabricating macroscopic components (i.e. >1 $cm^3$) with limited resolutions (i.e. >1 mil, or 25 micrometers). Recently, there has been growing interest in merging microelectronics with mechanical structures to create miniaturized microelectromechanical systems (MEMS) such as waveguide structures, microflulidic systems, and sensors. MEMS can offer cost savings, in terms of size reduction and/or increased functionality, especially when arrays of devices are implemented. Lithographic patterning is well established on the micro domain; however, structures are generally limited to extrusions of two-dimensional patterns because of the planar nature of lithography. Stereolithographic patterning on the micro-domain offers a greater optimization of structural elements and increased flexibility in package design.

Stereolithographic techniques utilizing photosensitive polymers have primarily suffered from either (1) poor layer thickness control and limited lateral resolutions or (2) significant process complexity because of the need for intermediate plating and development steps to be performed on a layer by layer basis. The previous methods reported utilize: (1) solution polymerization, (2) a combination of photoresist patterning with plating techniques, or (3) photoresist laminates.

In solution polymerization, a focused laser beam is scanned in a vector-based fashion over a solution of low molecular weight acrylic or epoxy resin. Laser-induced radicals promote polymer—polymer linkage (crosslinking) building up larger chained molecules, which then precipitate out of solution. The process was principally designed for the fabrication of macroscale parts and does not readily scale to the finer feature sizes and layer thicknesses achieved using integrated circuit (IC)-based resists and coating techniques. In solution polymerization, the coating technique is suited for macroscopic parts where individual layers are on the order of 10–50 micrometer thick. The fabrication process involves repeatedly lowering an elevated platform to a given depth per cycle permitting fresh material to overcoat the previously defined layer. The viscous nature of the resins used in solution polymerization require excessive leveling times to coat layers less than several micrometers. Even with plates or wipers to assist in leveling each layer, the coating technique cannot match the precision and uniformity achieved with the coating techniques employed in integrated circuit processing. The ultimate lateral resolutions of the photosensitive polymers used in solution polymerization are also inherently poorer than the photosensitive polymers used in integrated circuit processing. Solution polymerization-based systems rely on chain propagation of reactive radicals to initiate further polymerization; the photogenerated radicals, in the liquid state, readily diffuse. Lateral resolution is, as a result, limited. In addition, support structures are necessary to pattern reentrant structures (regions with no physical supports underneath) which are difficult to remove in the micro-domain.

In a second method, photoresist patterning and electroplating steps used in integrated circuit processing are combined to fabricate metallic structures. This process requires performing development, plating, and planarization steps for each and every layer, thereby adding significant process complexity and reducing throughputs. The photoresist/electroplating combination has only been viable for the creation of structures with a minimal number of layers. The introduction of the additional processing steps is not prohibitive in such circumstances.

Structures have also been fabricated using laminates of photosensitive polymers. Adhesives have been used to attach multiple layers of Dupont Riston®, a photopolymer material used to pattern printed circuit boards. The thickness of such laminates so fabricated have been on the order of 20 micrometers thick or greater; and it has been unclear whether the use of thinner layers is possible in view of manufacturing and handling constraints. Three-dimensional parts have been fabricated using a combination of repetitive exposure and plating techniques. Laminates of polymethyl methacrylate (PMMA) have also been employed having similar thicknesses. Such layers are attached using solvent bonding by melting a surface skin between the layers. In thin layers, this causes pronounced distortions in the previously exposed portions or, otherwise, adversely affects the development process.

None of the above methods can take direct use of advancements in high resolution photoresists and coating techniques already developed for the patterning of integrated circuits without the extra complexity of intermediate plating and development steps. The methods summarized above have been, in part, designed around a universal constraint that is posed because of solvent intermixing between layers of photoimageable resists. Solvent intermixing between the layers washes out previously defined features, alters the dissolution characteristics of the photoresist, and may possibly also cause thickness non-uniformities during coating.

Methods have been developed in semiconductor processing for layering multiple layers of photosensitive material. However, these techniques have been limited to bilayer or trilayer schemes and the resultant composite structures are not readily extendible to stereolithographic patterning that typically require a multitude of layers. Known methods for placing multiple layers of photosensitive polymers utilize: (1) two separate layers with immiscible solvents or an immiscible barrier layer between miscible layers (e.g. top-surface antireflection coatings, contrast enhancement layers, and lift-off based processes), (2) crosslinking to render an underlayer insoluble to the solvent of the next layer (e.g. bottom-layer anti-reflection coatings or in bi- or trilayer schemes where one layer serves as a planarization layer over reflective topographies), or (3) a sufficiently weak solvent in the applied layer to limit penetration into an underlayer to fabricate undercut profiles. All these methods present limitations in stereolithographic patterning.

All these methods present limitations in stereolithographic patterning and suffer from one or more of the following problems: Application of one layer destroys the photoimaging properties of another layer or the photoimaging properties are purposely destroyed through crosslinking to prevent solvent penetration, different developers are required for each layer complicating the development process or more typically, one layer is completely soluble in the developer of the other layer leading to delamination, or the composite structure is only compatible with a single exposure.

In the first case, different materials are applied for each layer. The top layer is purposely designed to be completely soluble in the underlayer's developer, or a different developer is required for each layer. In multiple layers of the composite structure, delamination would occur or different developers would be cycled on each layer complicating the development process. In the second case, the photoimaging properties of the resist are destroyed by crosslinking. Rather, a pattern imaged from the top surface is transferred through it in a second development stage, typically using a plasma based process. Again, each layer of the structure produced from this composite structure requires cycling between different development steps and significantly complicates the development process in multiple layers of this composite structure. Lastly, solvent weakening has been attempted in only a few limited cases. Different materials (or resists with different molecular weights) are used for each layer. The processing conditions used to apply the bottom layer either would destroy the photoimaging properties of the top layer preventing continued stacking of this composite structure or the process is only compatible with a single exposure for both layers.

A need exists for a method that overcomes the deficiencies of the aforementioned stereolithographic methods. A technique that leverages advancements in high resolution photoresists and coating techniques already developed for the patterning of integrated circuits without the extra complexity of intermediate plating and development steps would satisfy a long-felt need in the art.

Techniques to optimize the development process and increase patterning throughputs using simpler more cost-effective patterning solutions would greatly benefit adoption of the present technique.

SUMMARY OF THE INVENTION

Methods for patterning multilayer resists are provided. In one aspect of the invention, the method includes depositing a first layer of photoresist material from a first solution onto a substrate. A portion of the first layer is exposed to radiant energy. The first layer is treated creating a treated surface. Treating may occur before, after or during exposure. A second layer of photoresist material from a second solution is deposited atop the treated surface, the treated surface capable of inhibiting penetration of a solvent component of the second solution into the first layer. A portion of the second layer is exposed to radiant energy. The steps may be repeated until a multilayer resist having greater than two layers has been completed. The method may further include developing the layers in a single, final step to remove the exposed portions of each layer when the photoresist material comprises a positive resist. It may further include developing the layers in a single, final step to remove all but the exposed of each layer when the photoresist material comprises a negative resist. The method may further include heating the multilayer resist following exposing at least one portion. The photoresist material can include a one or more resins selected from phenol-formaldehydes, polyhydroxystyrenes and cyclic polyvinyls. The radiant energy can be laser radiation ranging in wavelength from about 4 nanometers to 520 nanometers. More preferably, from about 157 nm to about 465 nm. More specifically, the invention can be practiced with laser radiation sources such as helium-cadmium laser (operating at 325 nm or 442 nm), argon ion lasers (operating at 355, 257 or 248 nm), XeCl excimer lasers (operating at 308 nm), KrF (operating at 248 nm) and ArF excimer lasers (operating at 193 nm) and Fluorine lasers (operating at 157 nm), In additional embodiments, treating includes oxidation that may be accomplished using an agent selected from ozone, peroxide, oxygen plasma and combinations thereof. The treated surface may have carbonyl or hydroxyl functionality. Treating may increases the hydrophilicity or the hydrophobicity of the treated surface. The solution may comprise a solvent that is a mixture of liquids.

In a further embodiment, a method of making a multilayer stereolithographic preform is provided. A base layer of photoresist is deposited from a base solution onto a substrate. The base layer is surface treated to inhibit penetration of solvent into the base layer. An overlayer of photoresist is deposited from a second solution, the second solution comprising solvent, the overlayer located atop the base layer to create a multilayer preform. Subsequently developing the preform to create a multilayer stereographic pattern may be performed in a single, final step. Surface treating and depositing may be repeated a number of times, each additional overlayer deposited atop a surface treated overlayer.

In another aspect of the invention, a method of efficiently patterning a multilayer photoresist preform is provided. A first layer of photoresist is deposited onto a substrate. First portions of the first layer are exposed to a first dose of radiant energy. A second layer of photoresist is deposited atop the first layer and second portions of the second layer are exposed to a second varied dose of radiant energy. Modulation of the second dose is a function of second portion locations that reside atop first portions; such second portion locations being interior portions. The dose is greater for interior portions than for other second portions. The term "modulation" as used herein is intended to encompass any adjustment in time-integrated intensity or fluence. Exposing and depositing may be repeated a number of times, n, thereby creating an n-layer photoresist preform. Thus, in this aspect of the invention, the dose is modulated over different portions of a layer in stereolithographic patterning to preferentially enhance development within the interior of the structure to reduce total development times.

The present invention enables stereolithographic patterning using a single resist material and development step. The technique is compatible with resist materials which rely on chemically induced solubility changes from the photodecomposition of a sensitizing agent. These are the dominant resist materials used in semiconductor processing. Examples include conventional diazonaphthoquinone/phenol formaldehyde (DNQ/novolac) based resists, or acid-catalyzed poly(hydroxystyrene) or poly(vinyl-cyclic) systems. The resists are positive tone in nature, hence, exposed portions are removed in developer. The use of positive tone resists in stereolithography poses two additional challenges which to date have not been previously explored. First, new methods are required to optimize the development process in these positive tone resists. With negative tone resists, unexposed portions are soluble and removed in developer at a constant rate. However, in positive tone resists, the degree of solubility at a given developer normality depends on exposure dose. Since the resist is semitransparent at the given exposure wavelength, the dissolution rate decreases with depth within a layer.

To efficiently pattern large contiguous areas rapidly, a procedure has been developed using spot-size modulation of the focused laser beam to more efficiently pattern interior portions. Critical portions at the perimeter are patterned at high resolutions. The spot-size is progressively increased towards the interior allowing a controlled transition to coarser spot-sizes without impacting the exposure dose in critical portions. Patterning times are significantly reduced since in effect shells are patterned. An algorithm is defined to subdivide a layer into different zones, determine the appropriate focused spot-sizes used for each zone, and define the laser scan trace within a zone to enable efficient patterning of broad areas in positive tone resists. The technique relies on the fact that the actual intensity distribution within the transitional regions and interior portions do not have to be as tightly controlled as in the vicinity of the perimeter. The technique vastly simplifies the stitching of non-rectangular beams with lateral variations in intensity and relaxes the tolerances on alignment between different size beams.

Current patterning techniques using vector based laser scanning tools are unable to achieve high patterning throughputs in positive tone resists. Vector scanning is an attractive option in maskless patterning in rapid prototyping in terms of cost and simplicity compared to projection based methods employing a spatial light modulator or raster based laser scanning. In these systems, a focused laser beam can be scanned across the surface in an arbitrary fashion. Due to bandwidth limitations of the scanners, vector scanning approaches are best suited for applications where either outlines of a part or shells in combination with internal web-like features can be used to render the part. Negative tone resists allow parts to be patterned with shells and internal web-like features since unexposed portions are soluble in developer. For instance, in 3D patterning systems employing solution polymerization, interior portions are filled with a honeycomb pattern. With positive tone resists, however, because of the tone reversal, there is no equivalent web-like internal fill since entire regions must be exposed to alter solubility. Techniques which have used variable size exposure areas to fill internal sections image a variable rectangular aperture using a projection system simplifying field stitching. In addition, the energy distribution at the surface is constant independent of slit size for focused widths well above the diffraction limits of the projection system. Spot size modulation techniques using a variable sized beams has not been previously reported in stereolithographic patterning and in fact no occurrences have been found in the general literature even for two dimensional patterning. Unlike a mechanical tool-bit which occupies a fixed volume in space, the focused laser beam is circular and generally has a spatially varying lateral (i.e. Gaussian or Airy disk) distribution. It is difficult to develop a robust algorithm for both defining the appropriate beam diameter and incremental distances between different size beams for arbitrary geometries. There is, for instance, no analogous Fourier transform for decomposing a two dimensional area into a summation of Gaussian beams. Also, the dose uniformity is sensitive to any misalignment between beams.

BRIEF DESCRIPTION OF THE DRAWINGS

Advantages and features of embodiments of the presently disclosed invention will be readily appreciated as these become better understood by reference to the following detailed description when considered in connection with the accompanying drawings:

FIG. 16 is a flow chart representation to determine set traces offset from the perimeter by a specified distance;

DETAILED DESCRIPTION OF THE INVENTION

Figure 1:
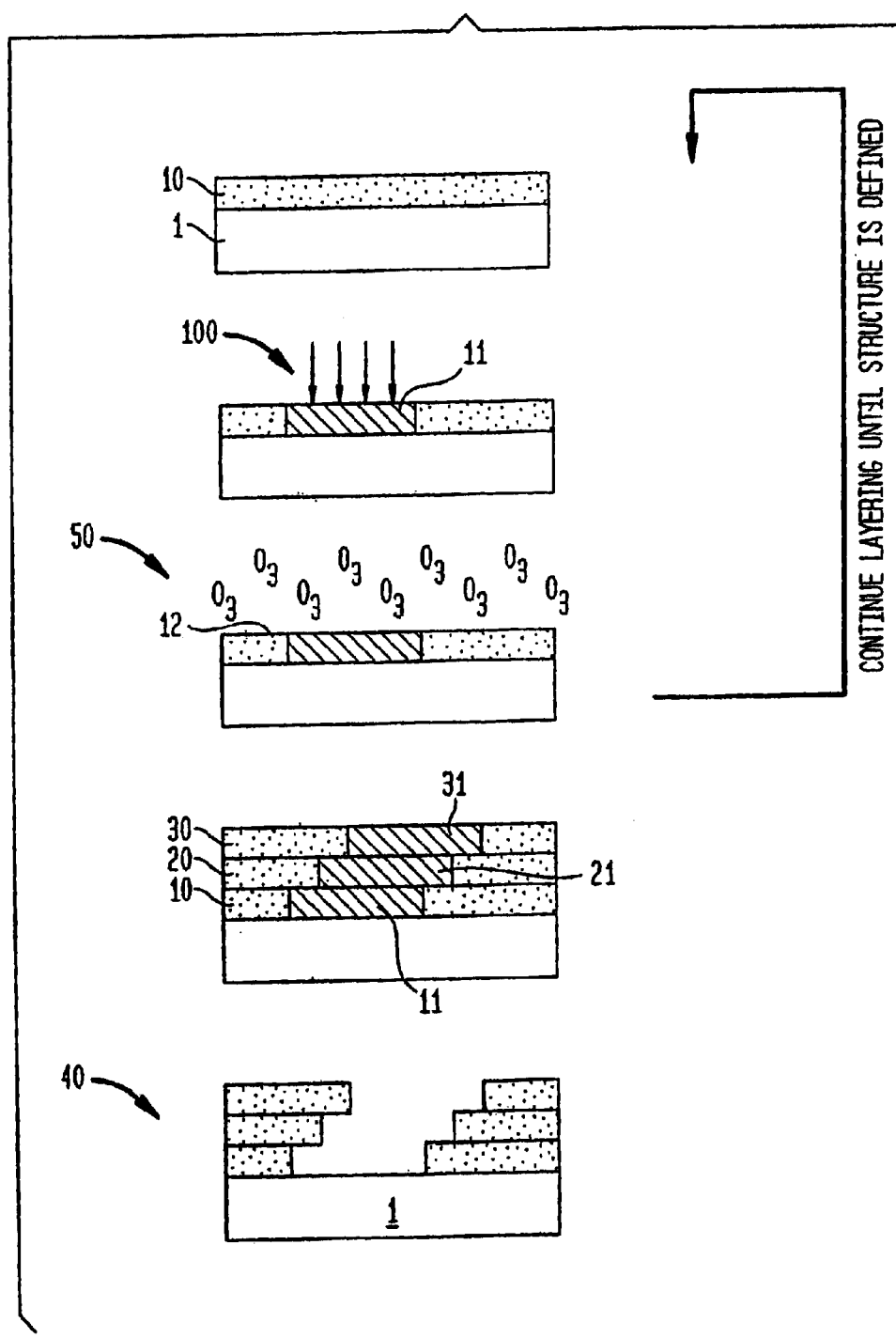
FIG. 1 is a process flow diagram for multilayer patterning according to the invention.

In the present invention, components are fabricated using photoresist materials and wafer coating techniques used in the semiconductor industry for high-resolution high-throughput lithography. Parts are patterned on a layer by layer basis using repetitive resist application and exposure techniques, followed by a single development step. To enable multiple layers of resists to be applied, a new technique has been developed to prevent solvent intermixing between layers which would otherwise strip or modify the latent image in previously defined layers. This is accomplished by tailoring the resist solvent system in a weaker less polar solvent and employing a surface treatment between individual layers to increase the hydrophilic nature of the surface. The surface treatment in effect repels the less polar solvent in the newly applied layer.

Utilizing a surface treatment to produce an insoluble barrier layer as opposed to weakening the solvent alone has a number of important advantages. Since only the surface of the resist is modified, the method of the invention requires only one photoresist material. No barrier layers or separate resists with immiscible solvents are used. This simplifies processing, both in terms of reducing the number of coating applications and development of the part. In addition, modification of the surface energy of the coating surface relaxes the level to which the solvent system must be weakened. Consequently, the invention provides the artisan with a broader range of solvents or co-solvent systems which can be chosen which have the appropriate evaporation rate and viscosity to produce uniform and durable thin films. In contrast, weakening the solvent alone creates two conflicting requirements. The solvent must be sufficiently strong to dissolve the solid contents of the resist while not penetrating the same material in a previous applied layer. In practice, prior to the present invention, this would require sophisticated preparation techniques analogous to those used to create super-saturated solutions. As the solvent is weakened, polymer—polymer interactions increase resulting in coiling of polymer strands. Coupled with the unstable state of the polymer in solution, this can lead to aggregation and phase separation during spinning as the solvent evaporates, producing defects and thickness variations.

The use of a surface treatment which does not modify the bulk dissolution properties of the photoresist has an additional advantage. Resists which rely on photochemically induced solubility changes from the chemical conversion of a photosensitive component can be used. For instance, the dominant resist materials used in integrated circuit manufacturing such as conventional diazonaphthoquinone/phenol formaldehyde (DNQ/novolac) based resists, or acid-catalyzed poly(hydroxystyrene) or poly(vinyl-cyclic) systems fall within this family. Prior to the surprising results and advantages of the present invention, stereolithographic processing with photosensitive polymers have relied on structural modifications of the polymer backbone through an increase in inter-molecular bonds (crosslinking) or fragmentation of the polymer network (chain scission).

There are a number of practical advantages with developing a 3D process compatible with the families of photoresist materials commonly used in integrated circuit fabrication. This process can for instance be applied directly in conventional IC based processes using a limited number of layers. There is also generally greater availability and experience with optimizing the performance of these materials for higher resolution applications. In addition, in positive tone resists relying on chemically induced solubility changes, unexposed material remains after development. The remaining material has relatively uniform mechanical properties. With negative tone resists, the remaining material has undergone crosslinking, which produces material shrinkage. Depending on the magnitude of the resulting residual stress, the resist may have to be specifically tailored for stereolithographic patterning to prevent distortions in the final part. This for instance has been one of the primary technological challenges in solution polymerization.

Although the use of positive tone resists in stereolithography has several advantages, their use poses two additional challenges. New methods are required to optimize the development process and achieve high patterning throughputs in these positive tone resist systems. Such new methods are addressed by the present invention.

In one aspect of the invention, a new exposure protocol is presented that optimizes the development process in positive tone resists to prevent excessively long development times and minimize resist loss in unexposed portions. With negative tone resists, unexposed portions are soluble and removed in developer at a constant rate. However, in positive tone resists, the degree of solubility at a given developer normality depends on exposure dose. Since the resist is semitransparent at the given exposure wavelength, the dissolution rate decreases with depth. If a constant exposure dose were used, development would proceed rapidly at the beginning of a layer, but deaccelerate rapidly near the bottom of the level. Development times would become excessive in multilayer applications, being equal to the time required to develop through one layer times the total number of layers. Compounding this factor, positive tone resists typically have lower differentials in dissolution rates between exposed and unexposed portions compared to negative tone resists. Over long development times expected with this multilayer resist application, this can lead to a loss of dimensional control from resist loss in unexposed portions.

To reduce the development times, the present invention provides techniques using higher doses over portions of a layer. The present invention provides the first instance of modulating the dose over different portions of a layer in stereolithographic patterning. Using higher doses within the central portion of the structure, for example, causes development to advance more rapidly within the interior of the structure proceeding more uniformly towards the perimeter of the part. Development times are reduced significantly compared to developing from the top layer unidirectionally through to the bottom layer which would otherwise occur if a uniform dose were used with positive tone resists.

In addition to providing dose modulation to optimize the development process in positive tone resists, a new exposure protocol is disclosed in vector based laser scanning systems to efficiently pattern broad areas in positive tone resists.

In vector based scanning systems, a focused laser beam can be scanned across the surface in an arbitrary manner, typically using galvanometers. Vector scanning is an attractive option in maskless patterning in rapid prototyping in terms of cost and simplicity. Spatial light modulator based projection systems and raster based laser scanning systems can be used in the present application, but to achieve high throughputs at high resolutions, are generally quite sophisticated and expensive using current technology. These systems are best suited for non-contiguous geometries such as integrated circuit or print topographies where the added expense incurred accessing every pixel at high resolution and throughput is required. Mechanical structures are however generally comprised of large contiguous areas in localized portions within the exposure field. In this case, a vector scan approach used in conjunction with the disclosed spot-size modulation algorithm can for many geometries provide similar throughputs and resolutions at significantly less cost.

Due to bandwidth limitations of the scanners, vector scanning approaches are best suited for applications where either outlines of a part or shells in combination with internal weblike features can be used to render the part. Negative tone resists allow parts to be patterned with shells and internal weblike features since unexposed portions are soluble in developer. For instance, in 3D patterning systems employing solution polymerization, interior portions are filled with a honeycomb pattern. Relatively high throughputs are obtained using a vector scanning approach since only a limited number of scans are required to delineate large regions. With positive tone resists, however, because of the tone reversal, there is no equivalent weblike internal fill since entire regions must be exposed to alter solubility. The present invention provides techniques useful in the modulation of laser beam spot size to improve throughputs for these types of resists. Interior portions are patterned at lower resolutions while higher resolutions are used at the perimeter of the part. The outlined technique allows simpler, less expensive vector based scanning systems to be employed at higher patterning throughputs.

Spot size modulation using a focused laser beam with Gaussian or Airy disc energy distribution has not been previously reported in stereolithographic patterning and in fact no occurrences have been found in the general literature even for two dimensional patterning. Unlike a mechanical tool-bit which occupies a fixed volume in space, the focused laser beam has a spatially varying lateral distribution. It is difficult to develop a robust algorithm for both defining the appropriate beam diameter and incremental distances between different size beams for arbitrary geometries. There is no equivalent Fourier Transform for decomposing a two dimensional area into a summation of Gaussian beams. Also, the dose uniformity is sensitive to any misalignment between beams. Techniques which have used variable size exposure areas image a variable rectangular aperture using a projection system simplifying field stitching. In addition, the energy distribution at the surface is constant independent of slit size for focused widths well above the diffraction limits of the projection system.

To efficiently pattern large contiguous areas rapidly, a procedure has been developed using spot-size modulation of the focused laser beam to more efficiently pattern interior portions. Critical portions at the perimeter where accurate edge and depth control is required are patterned at high resolutions. The spot-size is progressively increased towards the interior allowing a controlled transition to coarser spot-sizes without impacting the exposure dose in critical portions. Patterning times are significantly reduced since in effect shells are patterned. An algorithm is defined to subdivide a layer into different zones, determine the appropriate focused spot-sizes used for each zone, and define the laser scan trace within a zone to enable efficient patterning of broad areas in positive tone resists. The technique relies on the fact that the actual intensity distribution within the transitional regions and interior portions do not have to be as tightly controlled as in the vicinity of the perimeter. The technique vastly simplifies the stitching of non-rectangular beams with lateral variations in intensity and relaxes the tolerances on alignment between different size beams. It is particularly well suited on the microdomain due to the huge power density gains achieved by focusing the beam and high photosensitivity of the resists. Scanning speed rather than laser power limits throughputs even for relatively modest powered lasers.

The present invention provides an optically based stereolithographic patterning technique capable of high resolution, high throughput prototyping of 3D microscale parts. The present technique enables the lithographic process used in integrated circuit manufacturing to be stacked vertically over the same substrate using a single resist material and single development step. It is believed that this is the logical choice for patterning three-dimensional structures on the micro-domain—it leverages the incredible investment and success that has been achieved in photoresist development and processing tools. The process is compatible with positive tone resists which rely on photochemically induced solubility changes, the dominant type of resists used in integrated circuit manufacturing. These materials have the added advantage that the remaining material after development has spatially uniform mechanical properties unlike negative tone systems, which rely on crosslinking. A new exposure protocol using dose modulation reduces development times while improving dimensional control. A new spot-size modulation algorithm also enables positive tone resists to be patterned at significantly higher throughputs using vector scanning based systems. Parts fabricated with this technology can play an integral role in optimizing structures and simplifying packaging constraints for MEMS devices where micron resolutions are required.

The features and other details of embodiments of the present invention are now more particularly described and subsequently claimed. It will be understood that the particular embodiments of the invention are shown by way of illustration and not as limitations of the scope of the invention.

Embodiments of the present invention are directed to processes that enable fabrication of three-dimensional structures utilizing photoresist materials known in integrated circuit manufacturing. Embodiments enable the structure formed by lithographic process to be stacked vertically over the same substrate using a single resist material and one final development step. Structures are fabricated layer by layer using repetitive resist application and radiant energy exposure steps, followed by a single chemical development step. Photoresists are typically dissolved in a polar solvent such as propylene glycol monomethyl ether acetate or ethyl lactate. To prevent solvent intermixing between layers, which would otherwise wash out previously defined features, alter the dissolution characteristics of the photoresist in developer, and possibly cause thickness non-uniformities during coating, the photoresist is first constituted into a weaker (i.e. less polar) solvent. An additional surface treatment, (e.g., oxidation), which does not alter the bulk dissolution properties of the resist is performed between the foundation of the layers. The surface treatment increases the hydrophilicity of the surface of the previously applied layer, thereby making that surface of that layer less soluble. In effect, the solvent is repelled when a subsequent layer is formed. This enables a stack of successively photoimaged layers to be prepared. The stack of layers is then developed in a single step.

Throughout this description and appended claims, the phrase "surface treating" is used in conjunction with methodology to create a surface on a given layer that inhibits penetration of solvent into the given layer. "Exposing" a layer refers to the submission of that layer to radiant energy. "Developing" refers to the creation of a pattern, usually by chemical means and typically as a result of changes in layers caused by previous exposure of resist to radiant energy. A preform denotes a structure which has not, as yet, been developed. A preform is "patterned" before it is developed but may be referred to as a pattern after it is developed. A "positive tone resist" is one in which, during development, the exposed portions are removed while a "negative" resist has everything but the exposed portions removed upon development.

FIG. 1 illustrates the basic patterning process of the present invention. Photoresist layer 10, formulated in an appropriate solvent system, is applied to a substrate. Photoresist layer 10, as applied, usually comprises a resin, a photoactive component (PAC) which alters the dissolution properties of the photoresist, and a solvent. Appropriate solvent systems are disclosed below. After coating, a post-apply-bake (PAB) is performed to drive out the solvent. Each layer is then patterned from information derived from slices cut from a three-dimensional representation of the ultimate component. For illustration purposes only, a positive tone resist is considered. Radiant energy 100 is shown to expose a desired portion 11 of photoresist layer 10. This results in exposed portion 11 attaining enhanced solubility in developer. The exposure system providing radiant energy 100 should be capable of providing a controlled energy dose over selected regions of layer 10. It should also be capable of accurate positioning leading to an accurate alignment of exposed regions 21 and 31 in subsequent exposures. After exposure of each layer 10, a surface treatment is performed. This treatment is believed to increase the hydrophilicity (polar nature) of surface 12, but does not alter the bulk dissolution properties of the resist. For example, treatment with "ozone ambient" 50 has been effective in creating surface 12. The process is repeated layer by layer (photoresist layers 10, 20,30, . . . exposed portions 11,21, 31 . . . ) until patterning is complete and a preform created. The solvent from each successively applied photoresist layer is repelled from the surface of the previously defined layer preventing solvent intermixing between layers. Note that in certain resist systems an additional heat treatment, commonly referred to as a post-exposure-bake (PEB), is required prior to developing in order to alter solubility in differentially exposed regions. The latent image is then developed in a single procedure to create 3D structure 40. Note that since only the surface of the photoresist is modified through treatment, the process is compatible with both positive and negative tone resists that rely on either chemically induced solubility changes or structural modifications in the polymer backbone over a broad range of exposure wavelengths.

Figure 2:
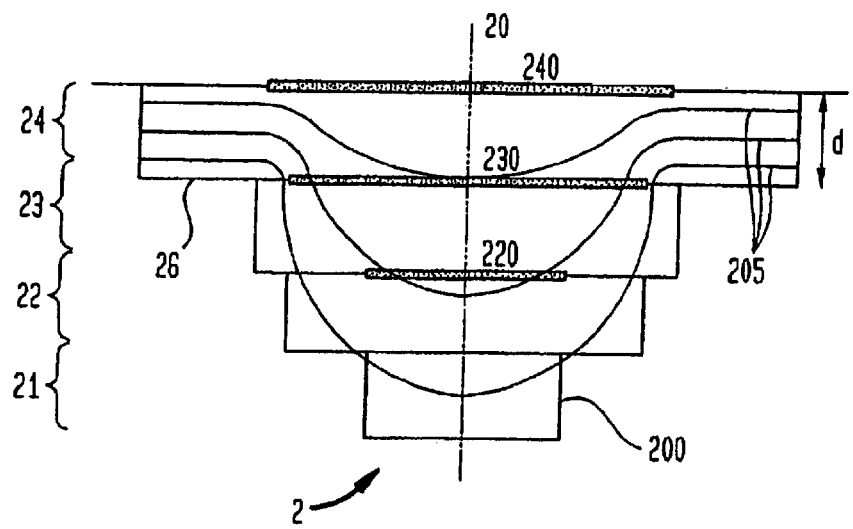
FIG. 2 shows a graphical representation of an embodiment of the invention providing a scheme for exposure dosing.

The particular use of positive tone resists to pattern 3D objects poses two additional processing challenges. A method is presented that uses dose modulation of the radiant energy provided to a layer. In positive tone resists, the degree of solubility at a given solution normality of developer is proportional to the energy dose. Since the resist is semitransparent at the given exposure wavelength, the solubility of the resist will decrease with depth. In order to reduce development times, higher doses may be beneficially used over "interior" portions of the part; such "interior" portions will ultimately be located at a specified distance from the bottom of the part. This distance may be calculated based upon the absorption properties of the resist and the dissolution characteristics of the photoresist at a given developer strength. Not only does development proceed more rapidly within a layer in portions exposed to higher doses, but increased light penetration into underlayers also increases the solubility in these portions. In this manner, development proceeds more rapidly over "interior" portions of the preform. The basic concept is illustrated schematically for a generic profile 2 extending multiple layers (refer to FIG. 2). A discretized perimeter 200 is formed from slices cut from the part. For convenience, each subsequently formed layer 21, 22, 23, 24 of FIG. 2 has constant thickness. (It is not necessary for layers to have equal thicknesses.) Portions of the surface of layers 22, 23, and 24 receive higher doses; the portions are represented by thicker lines 220, 230, and 240. Light leakage between layers over interior portions increases the solubility in developer in affected regions. The dotted lines 205 represent a resist front that propagates during development. If a constant exposure dose were used on each layer, the exposure energy used would be limited to the value which causes development to cease at the bottom of the stepped portions such as portion 26 on top layer 24. Development would proceed rapidly near the top of a layer, but decelerate rapidly near the bottom of that layer. In a multi-layer structure, this could increase preform development times by orders of magnitude. Also, positive tone resists typically have lower differentials in dissolution rates between exposed and unexposed portions compared to negative tone resists. Over the long development times expected in this multilayer resist application, this can lead to a loss of dimensional control due to the unexposed resist loss becoming more pronounced.

Figure 3:
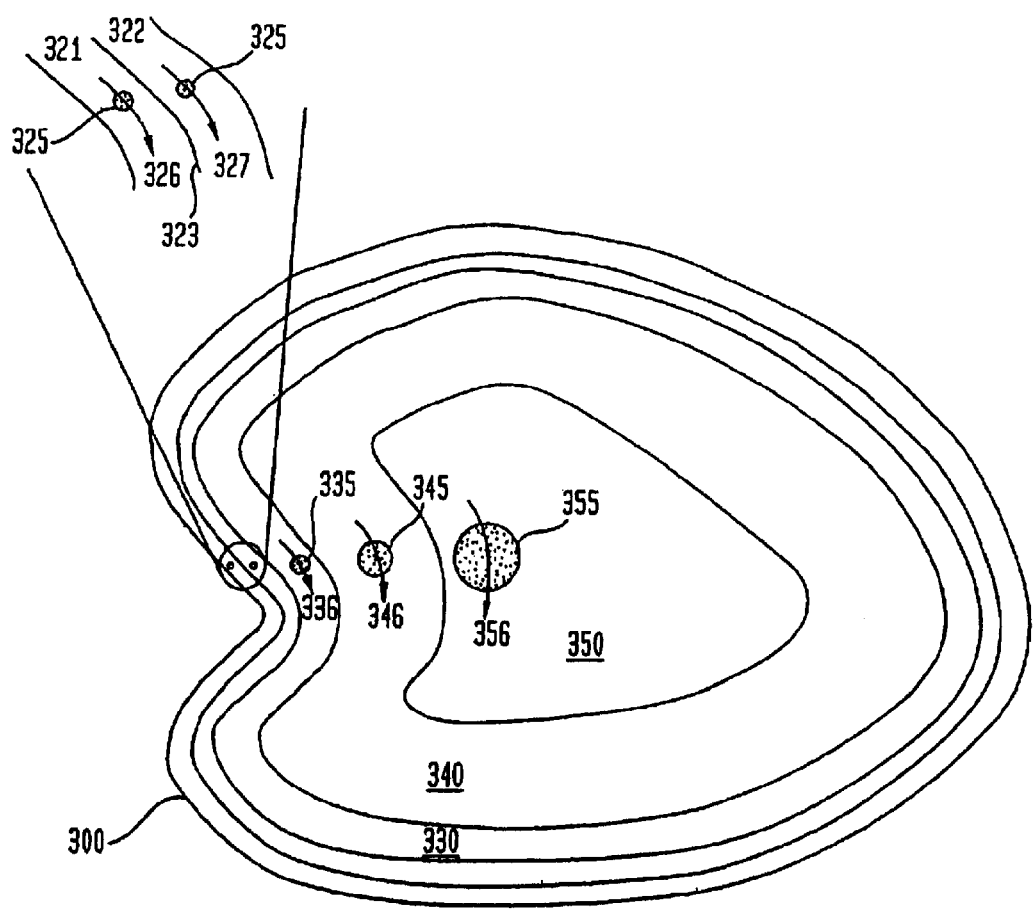
FIG. 3 shows a graphical representation of an arbitrary geometry subdivided into different bands patterned at varying resolutions.

To address another positive tone resist processing challenge, a new algorithm for use with vector scanning laser-based exposure systems, has been devised, in an embodiment, to efficiently pattern large contiguous areas using multiple beam sizes. This technique is thought to overcome the limitations of stitching together non-rectangular beams having non-uniform energy distributions. The algorithm is based on the fact that the actual dose within the portions of the interior of the structure (closer to centrosymmetric axis 20) do not have to be as tightly controlled as in the vicinity of the structure perimeter, as long as the dose is sufficiently high that development proceeds rapidly to prevent excessive development times. This observation significantly relaxes the constraints on both absolute beam sizes and overlay alignment between beams. The situation is summarized schematically in FIG. 3 for a generic layer geometry where the portion to be patterned is bounded by the perimeter edge 300. Critical portions in a layer are defined as falling within a specified distance from the perimeter 300 of the structure and are represented by the band 321. Points falling in critical region 321 are patterned at high resolutions and controlled dose following the contour of the part. Region 322 is a transitional region, patterned at high resolution to allow larger beams to be used without impacting the dose in the critical region. Bands 330 and 340 are defined as intermediary zones, each patterned at progressively larger spot sizes. The spot size increases to the maximum allowable level or until power limitations prevent further increases. The final zone patterned at this maximum spot size, 350, is termed the course zone. The width of each band is chosen allowing a controlled transition to larger spot-sizes without impacting the energy distribution in the critical zone 321. For comparison purposes, the relative magnitude of the various spot-sizes (defined as the distance where the intensity distribution as fallen to $1/e^2$ from its peak value) are shown in region 321, 322, 330, 340, and 350 as 325, 335, 345 and 355 respectively. All different spot-sizes are scanned following the contour of the part to maintain accurate lateral and depth control. A portion of the laser beam path in each region 321, 322, 330, 340 and 350 is shown for each spot size 325, 335, 345 and 355 and are denoted as 326, 327, 336, 346 and 356 respectively. In many cases, the above technique can reduce patterning times by at least an order of magnitude.

Further description follows three sections on surface interlayer modification, variable dose delivery, and variable spot-size delivery.

Surface Interlayer Modification

Solubility Parameter Theory (SPT) is a semi-empirical model, which can be used to assist in selecting and tailoring a co-solvent system for polymer systems to achieve a desired result. In this model, the "power" of a solvent is characterized by the relative levels of intermolecular attractive forces that maintain the solvent in a liquid form. There are two types of intermolecular forces: dispersive and polar. Dispersive forces result from weak electromagnetic attractions between fluctuating dipole moments between the positive nucleii and the negative electron cloud in each molecule. Polar forces arise from stronger electromagnetic attractions between permanent dipole moments. Normally, solvents are chosen that have intermolecular forces similar to the interactive energies between polymer chains. In this manner, the solvent can mix freely with the polymer allowing a uniform solution to be produced. This places a limit upon the differences between polar and dispersive forces; otherwise, the more strongly attracted molecules (i.e. either solvent-solvent or polymer—polymer) will stick together excluding the weakly attracted molecules.

Figure 4:
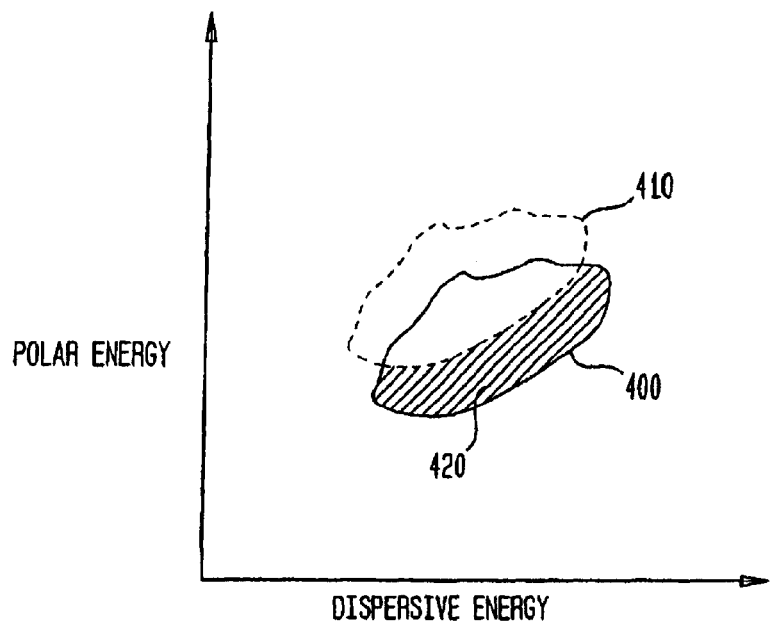
FIG. 4 is a schematic representation of a solubility map summarizing, in accordance with an embodiment, a method employed to prevent solvent penetration.

Solvent intermixing between layers must be prevented in the context of the embodiments disclosed herein. With reference to FIG. 1, the resist of layer 10 has a weaker less polar solvent which is still sufficiently strong to dissolve the solids content of the resist. To fully prevent solvent intermixing, the hydrophilicity or polar nature of the surface layer 12 is then increased through treatment by an oxidizing agent 50 (e.g. ozone). Other agents thought to provide effective treatment include oxygen based plasmas and hydrogen peroxide. The surface energy of layer 10 is altered sufficiently such that the weakly polar solvent for subsequent photoresist layer 20 falls outside the solvent penetration limits of the treated surface 12. In this context, solvent penetration encompasses both solubility and swelling. These concepts are shown schematically in FIG. 4 applying the formalisms of SPT theory. The solid line 400 represents the zone of solubility of the solids content of the photoresist. Solvents whose polar and dispersive solubility parameter fall within the region defined by the solid line 400 dissolve the solids content of the photoresist. The surface treatment creates a new zone of solvent penetration for the surface layer represented by the dashed line 410. In an embodiment, a solvent is chosen which falls within the solubility limits of the solid content of the resist 400, but outside the solvent penetration limits of the treated surface 410. Solvents, which fall within region 420, represented by the hatched pattern, dissolve the solids content of the resist enabling the polymer to be applied from solution. The solvent for layer 20 in this region, however, does not penetrate through a surface treated underlayer.

In an embodiment, diazonaphtoquinone/phenol-formaldehyde (DNQ/novolac) based resists are capable of being applied as layers 10 with the process flow shown in FIG. 1 enabling 3D micro-stereolithography. For almost two decades, DNQ/novolac based resists have been the workhorse of the semiconductor industry. Their basic chemistry is well understood and their lithographic performance can be predicted to high accuracy. They are sensitive to optical radiation in the near ultra-violet range (NUV) between about 300 to 450 nm. Within this exposure regime, several continuous wave sources exist simplifying the design of a laser vector-based scanning exposure system. In addition, no post-exposure-bake is required to alter solubility simplifying the overall process. These resists are composed of a novolac resin. Novolac is normally base-soluble. The resin is loaded with approximately twenty to thirty percent by weight with DNQ. This renders the material base insoluble. The DNQ serves as the photoactive component (PAC). Upon exposure to radiant energy, the DNQ is transformed into a base soluble carboxylic acid derivative, allowing the exposed portions to be subsequently dissolved in an aqueous base developer. There is a change of several orders of magnitude in the solubility upon exposure of the DNQ.

Figure 5:
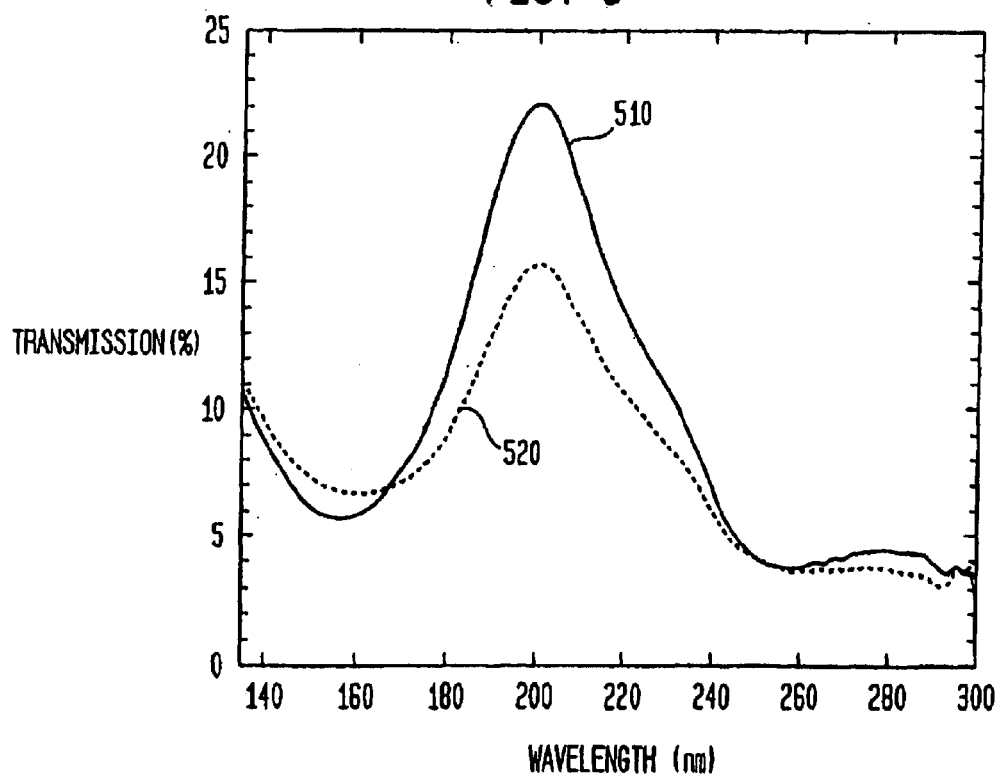
FIG. 5 is a graphical representation comparing the vacuum ultra-violet spectrum of an untreated and ozonated 30 nm thick film of DNQ/novolac resist.

Exposing novolac based resist to ozone is one such method to alter the polar nature of the surface. In addition, it has been shown that limiting the depth of the effectively treated surface layer to within about 15 nm will essentially prevent an appropriately chosen solvent from penetrating. As a result, the bulk dissolution properties of the resist 10 beyond this 15 nm depth are not modified by the treatment. In addition, the treated layer is itself soluble in developer. It therefore does not inhibit development from layer to layer, yet it is sufficiently thin that capillary forces and transport limitations are believed to be the primary factors preventing significant undercutting between layers. Properties of the surface treatment are experimentally verified using contact angle studies, vacuum ultra-violet spectroscopy, and development rate monitoring. It is well established that ozone readily cleaves carbon-carbon double-bond structures forming highly polar carbonyl derivatives (see for instance, Photodegradation, photo-oxidation and photostabilization of polymers, B. Ranby and J. F. Rabek, (John Wiley and Sons, New York, 1975), pg 353). Classically, angle resolved X-ray photoelectron spectroscopy (XPS) analysis has been used to determine the chemical composition of surface layers exposed to ozone. As an alternative metrology tool, vacuum ultraviolet (VUV) spectroscopy can provide qualitative information on the chemical transformation on an ozonated surface due to the extremely high absorbance of organic functional groups in this portion of the electromagnetic spectrum. VUV spectroscopy has been performed to compare the absorption properties of novolac films before and after apsorption. An approximately 30 nm thick film was treated to ozone of sufficient duration (as explained in subsequent text) to penetrate approximately the top 15 mm of the coated film. In the absorption spectrum shown in FIG. 5, the primary absorption band of the untreated film (curve 510) centered around 200 nm is due to contributions from the benzene-ring containing backbone of the novolac resin. After ozonation (curve 520), the peak absorption at 200 nm has decreased due to the breakdown of the aromatic ring. The resulting formation of carbonyl functional groups is indicated by the broadening of the absorption band centered around 160–175 nm where this species has its absorption maximum.

Figure 6A:
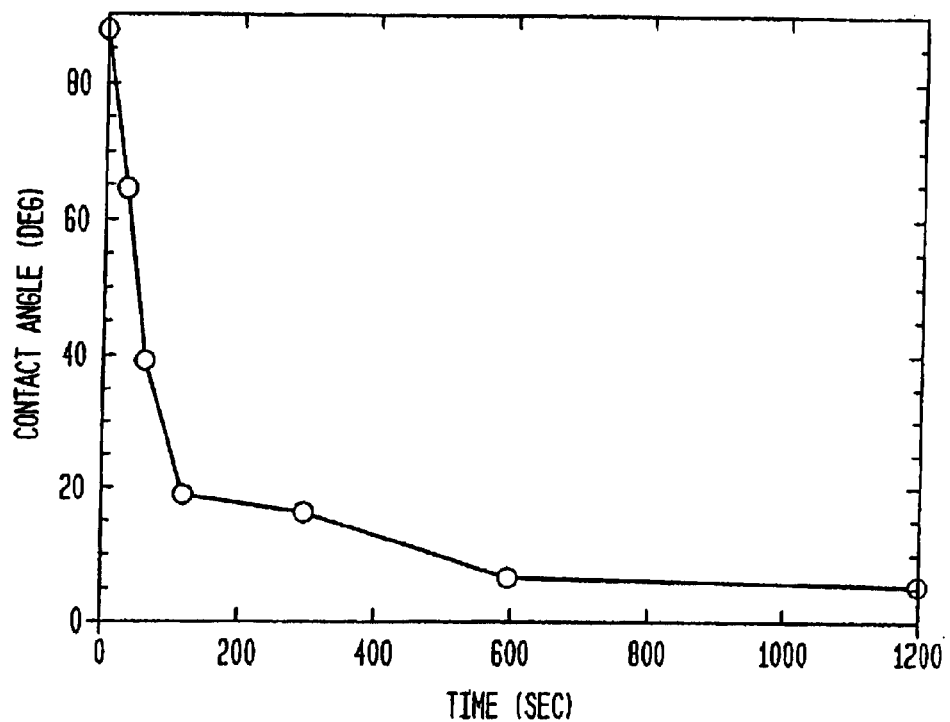
FIG. 6A is a graphical representation of the contact angle of water on the surface of a DNQ/novolac resist as a function of ozone treatment time.
Figure 6B:
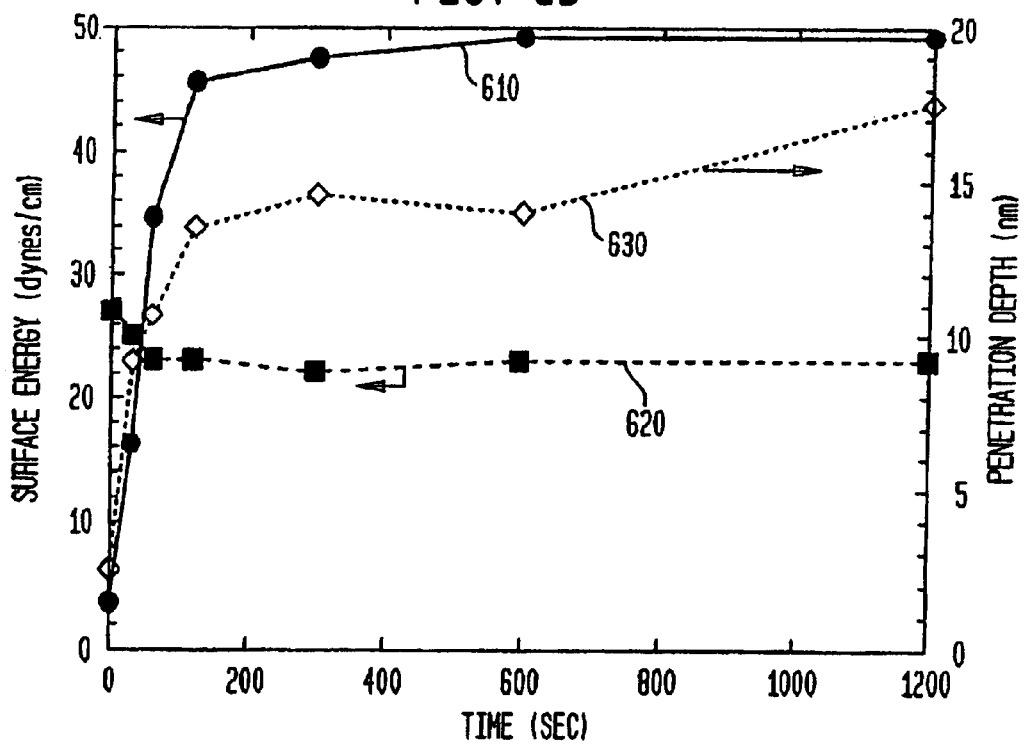
FIG. 6B is a graphical representation of the corresponding polar and dispersive components of surface energy and penetration depth of the chemical conversion of the surface of DNQ/novolac resist as a function of ozone treatment time.

Contact angle measurements are a highly sensitive method to characterize the subsequent changes in the polar and dispersive components of surface energy caused by ozonating the resist surface. Following the method presented by Deckert et al (C. A. Deckert and D. A. Peters, "Adhesion, wetability, and surface chemistry" in *Adhesion aspects of polymeric coatings*, edited by K. L. Mittal (Plenum Press, New York, 1983), pg. 469–498) dispersive and polar contributions to surface energy can be determined from the contact angle formed between the treated resist surface and two different liquids. FIG. 6a shows the change in contact angle for 1 μL droplets of water placed on surfaces exposed to ozone over increasing time. A simple delivery system was used to treat the surface. The ozone was produced from an ozone generator manufactured by Ozone Services (model number GE60/FM500) using a pressurized tank of 99.5% oxygen as the source gas. The estimated ozone generated at the output of the unit is approximately 1 to 2%. The output of the generator is connected to the small end of a funnel with the larger end placed directly over the sample. As shown in FIG. 6a, the contact angle decreases substantially for highly polar water, indicating increased wettability of the surface. FIG. 6b shows calculated changes in polar (curve 610) and dispersive (curve 620) components calculated using contact angle measurements from droplets of water and toluene. The results demonstrate that at modest concentrations of ozone, the polar component of the surface energy is raised significantly and will saturate after several minutes. We have also observed the surface energy increases more rapidly at elevated temperatures or at higher levels of ozone. As such, treatment times can possibly be reduced by exposing layers of resist to ozone at elevated temperatures or at higher concentrations of ozone.

Figure 7A:
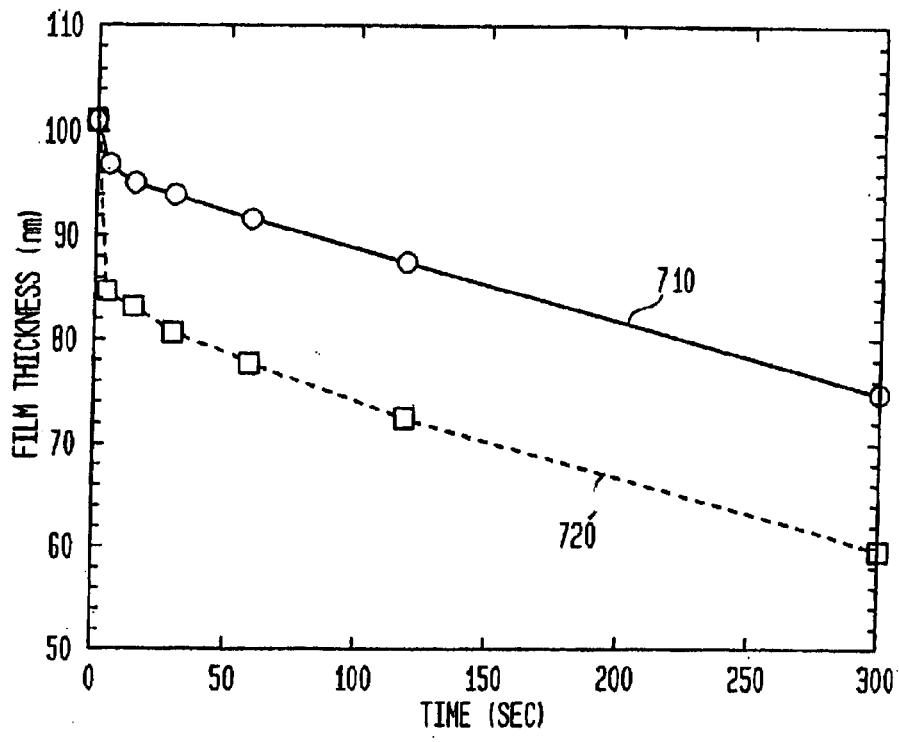
FIG. 7A is a graphical representation of film loss in aqueous base developer as a function of time on an untreated and an ozonated thin-film of unpatterned DNQ/novolac resist.
Figure 7B:
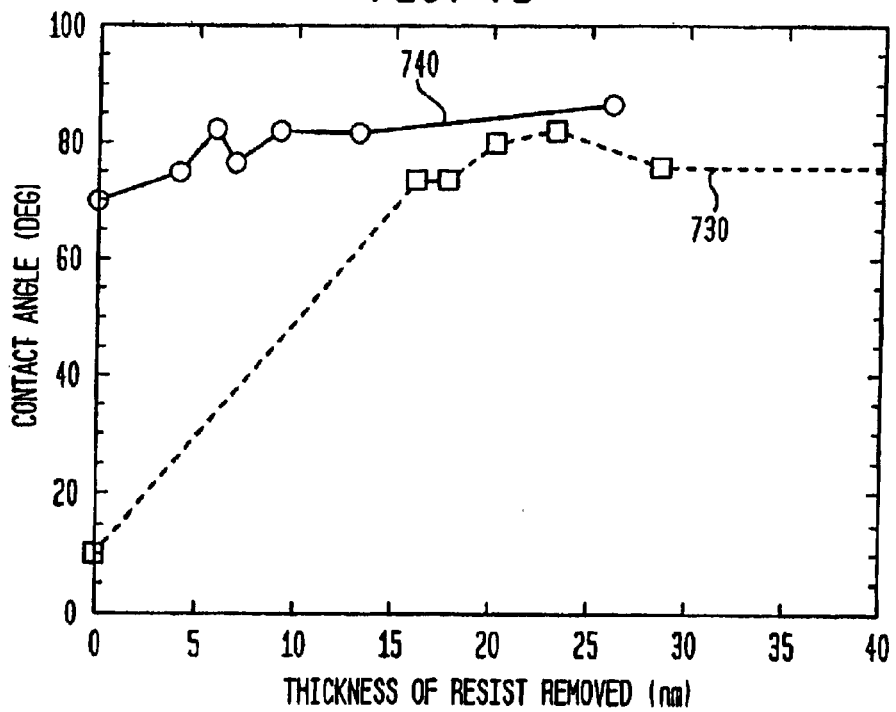
FIG. 7B is a graphical representation of the contact angle formed between water and the surface of DNQ/novolac resist for the same films after various stages of immersion in aqueous base developer.
Figure 8A:
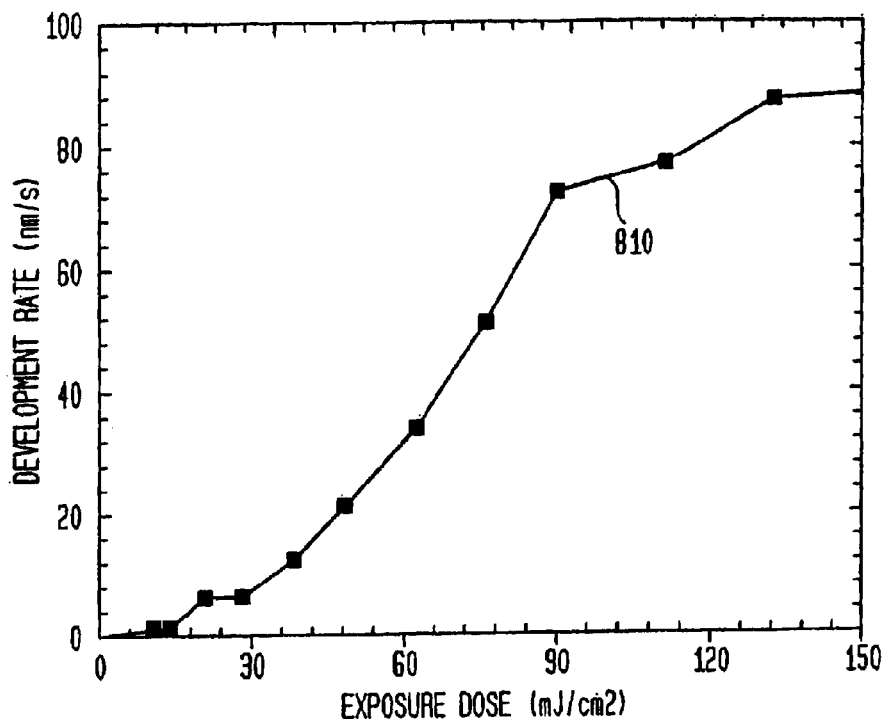
FIG. 8A depicts the average bulk dissolution rate of novolac resists untreated.
Figure 8B:
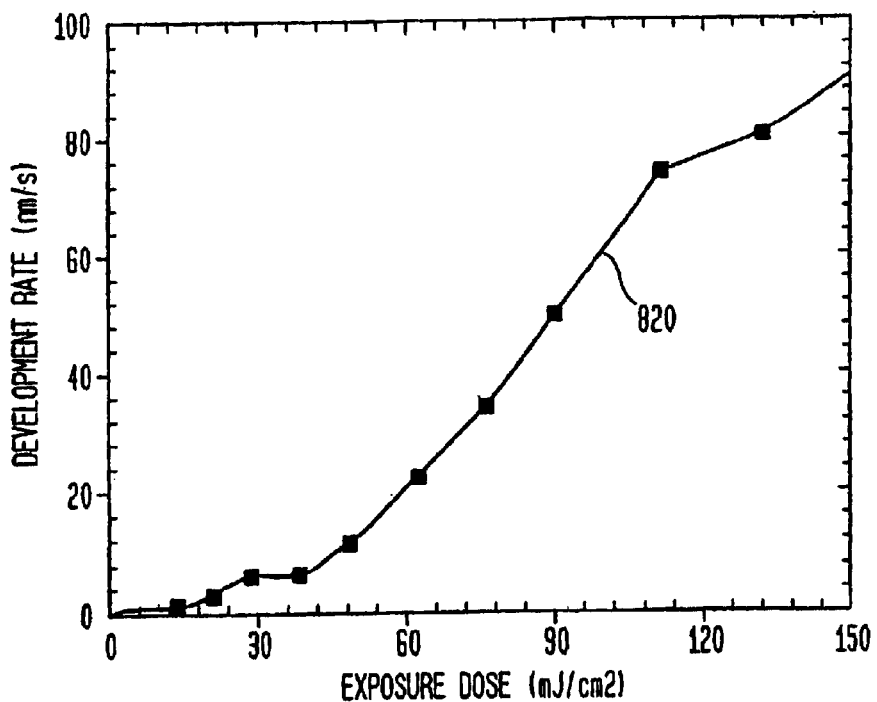
FIG. 8B depicts the dissolution rate of the same resists after being treated with approximately 1% ozone in air for five minutes.

The penetration depth of the ozone treatment has been estimated by measuring the remaining film thickness ellipsometrically both on an untreated and ozonated novolac resist after various stages of immersion in 0.28 N potassium hydroxide (KOH) developer (see FIG. 7a). The initial rapid film loss in the sample exposed to ozone (curve 720) of sufficient duration to saturate the polar component of the surface energy is consistent with the presence of carboxylic acid in the surface layer. A slight initial drop off in film is also observed on the untreated photoresist film (curve 710). This drop is believed to be due to environmental contaminants. After the removal of the treated layer, the bulk dissolution characteristics of unexposed resist are similar in the two cases. Contact angle measurements were also performed after various stages of development as shown in FIG. 7b. After the initial 15 nm of film is removed on the ozonated surface (curve 730), the contact angle is restored to the value observed on the untreated surfaces (curve 740) further establishing the penetration depth of the ozone process can be limited to approximately the first 10–15 nm. Using similar techniques, the penetration depth as a function of ozone treatment time is plotted in FIG. 6b. as curve 630 along with the curves representing the change in surface energy (610 and 620). Consistent with the findings of limited penetration of the ozonation process (FIG. 6b) and similar bulk dissolution rates of unexposed films in aqueous base developer (FIG. 7a), exposure to ozone does not appear to alter the bulk dissolution properties of exposed photoresist. FIG. 8 compares the average dissolution rate measured with a Perkin Elmer Development Rate Monitor™ between approximately 1.5-μm thick samples of Shipley Microposit® S1800 novolac resist (Shipley S1800) treated with ozone (curve 820) for 5 minutes in approximately 1 to 2% ozone and one left untreated (curve 810). Samples were developed in 0.26 N potassium hydroxide. Dose matrices necessary for establishing development rates were performed using a vector-based laser scanner utilizing a HeCd laser operating at 325 nm. No significant changes in bulk development rate occurred.

Figure 9:
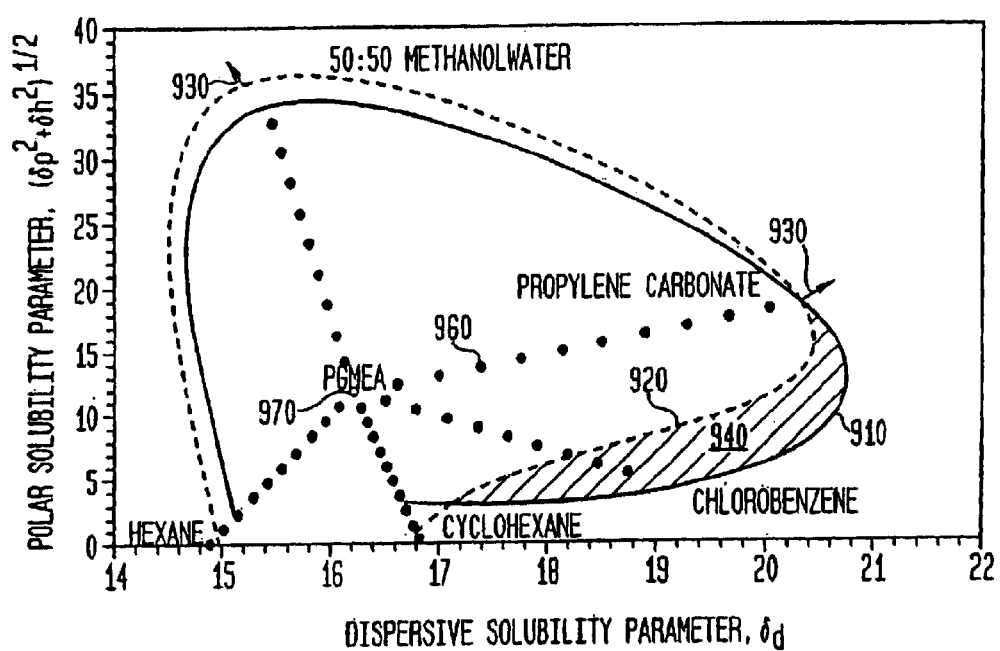
FIG. 9 is an experimentally measured solubility map of untreated and ozonated DNQ/novolac resist.

In a further embodiment, it has been demonstrated that for the novolac resist system described, a mixture of a true solvent such as propylene glycol monomethyl ether acetate (PGMEA) and a less polar, moderately high dispersive solvent, such as chlorobenzene, is a co-solvent system capable of preventing solvent intermixing between layers. Solubility mapping can be used to identify this and other solvents or co-solvent systems with solubility parameters sufficient to dissolve the solids content of the resist, but incapable of penetrating a surface treated layer. FIG. 9 shows an experimentally determined solubility map of Shipley S1800 DNQ/novolac resist before treatment and after ozonation of sufficient duration to raise the polar component of the surface energy to 48 dynes/cm. The solubility map was compiled using swelling based test procedures, one common technique employed (see, for instance, CRC Handbook of Solubility Parameters and Other Cohesion Parameters, A. F. M. Barton (CRC Press, Boca Raton, 1991) pg. 421). In this method, a solvent is applied to a polymer film and the resulting thickness change measured. By repeating the experiment with a number of different non-solvents with different polar and dispersive components, the general outline of the solubility zone can be determined. In the present case, a photoresist film approximately 100 nm thick was spin-coated on a silicon substrate and baked for 1 min at 100° C. to remove residual solvent. Co-solvent systems were then applied to the surface and the samples subsequently spun (on a spin-coater) to drive off excess solvent. Co-solvent systems were formulated using different ratios of a true solvent and weaker non-solvent. To first order, the solubility parameter of each co-solvent system can be estimated by adding the solubility parameters (i.e. polar and dispersive) of each constituent according to its relative level by volume in the mixture. In this manner, the perimeter of the solubility and solvent penetration zone can then be delineated along various trajectories emanating from a true-solvent for the system. In this case, propylene glycol monomethyl ether acetate (PGMEA) was used as the true-solvent, a standard spin-coating solvent used for DNQ/novolac based resists. The weaker, non-solvents, were: hexane, cyclohexane, chlorobenzene, propylene carbonate, and a mixture of one part water with one part methanol. Points on the graph such as 960 represent the combined solubility parameters of the various co-solvent mixtures tested. Stars such as 970 represent the solubility parameters of the single solvents. For simplicity, a two-dimensional solubility mapping has been used in FIG. 9. In this case, the polar component incorporates two separate subcomponents, both representing permanent charge imbalances in a molecule due to unequal electron sharing. The first, referred to as the hydrogen bonding component, $\delta_h$, quantifies the attractive forces arising between unequal sharing of an electron withdrawing group such as oxygen or chlorine with hydrogen. The resulting partially exposed hydrogen nucleus can exert a significant force on other atoms in neighboring molecules. The other component, $\delta_p$, somewhat confusingly termed the polar component, characterizes all other partially electron cloud shielded non-protonic bridge interactions from permanent charge imbalances.

The solid line 910 delineates the boarder of the solubility zone of the solids content of the resist as measured ellipsometrically after solvent application. The dashed line 920 delineates the solvent penetration zone of the treated surface layer. It includes the region of any thickness change from either solubility or swelling. Arrows 930 on the border indicate cases where the actual perimeter of the solubility zone could not be defined since the test non-solvent even without dilution with the true solvent, PGMEA, either partially or completely dissolved the thin layer. A solvent system falling within 910 but outside 920 is sufficient to dissolve the solids content of the resist while not penetrating surface treated layers. This region (940) is denoted by the cross-hatch pattern. As can be seen from the graph, the greatest differential between the solubility of an untreated and ozonated surface occurs near the border between chlorobenzene and PGMEA. Swelling is otherwise observed with the less polar, less dispersive solvents hexane and cyclohexane.

To more closely examine the border defined by the trajectory between PGMEA and chlorobenzene, a complementary test was performed in which different ratios of PGMEA and chlorobenzene were spin-coated over a 1.5 μm thick layer of photoresist. Prior to applying the various co-solvent mixtures, the layer was patterned with a 400-μm period grating and subsequently ozonated for different times. Only under conditions where solvent penetration was prevented were the full step heights measured without any apparent distortion.

The results of the solubility mapping and additional test on patterned surfaces demonstrate with the appropriate combination of solvent system and surface treatment, the loss of resist thickness and feature definition can be prevented while still maintaining solubility of the solid contents of the photoresist. In practice several additional considerations related to sample preparation, coating uniformity, and adhesion between layers can be considered in optimizing the specific ratio of each constituent of the solvent and ozone treatment conditions. As solvent power is weakened, polymer—polymer interactions increase resulting in the coiling of polymer strands. Resist preparation may be both more difficult and time consuming and coating uniformity may suffer for a solvent system whose combined solubility parameter falls just at the perimeter of the solubility zone for the solid content of the resist. It can also be advantageous to limit the extent of the surface energy modification due to the ozone surface treatment. Poor coating uniformity and adhesion failure can occur when a large difference exists between the surface energy of the treated surface 12 and newly applied layer 20 (FIG. 1). Prolonged ozone exposure also increases the penetration depth of the surface treatment leading to more pronounced undercutting between layers.

In practice, none of the above issues poses fundamental limits on the process. It was difficult to dissolve Shipley S1800 photoresist in chlorobenzene/PGMEA mixtures near the solubility limit (910). However, at lower ratios (typically 0.17–0.25 parts PGMEA to 1 part chlorobenzene), mixtures could be readily produced allowing uniform thin films to be spin coated. Test structures were used to study the interface between layers. Three individual layers of reformulated resist (10, 20 and 30) were spin coated on a silicon substrate 1. Between application, each layer was ozonated 50 to prevent solvent penetration. Cross hatch patterns were then exposed through the composite three layer structure. Scanning electron microscopy was used to investigate the interface between the layers after development. The interface was on the same scale as the standing wave patterns produced in the film during exposure growing correspondingly with the degree of ozonation. It is believed capillary forces and mass transport limitations are the primary factors limiting the degree of undercutting. No delamination of layers was observed.

It should be understood that the combination of ozone treatment and solvent tailoring is not specific to the novolac resist system. Ozone is known to oxidize and eventually degrade hydrocarbon-based polymers even in the absence of ultra-violet light. It has been investigated as a surface treatment technique to increase the surface energy of polymer materials to improve adhesion and bonding strength. Families of polymers which oxidize include polyphenyl, polynaphthalene, polycarbonate, polyisobutylene, polymethylene, polypropylene, polystyrene, poly(vinyl-cyclohexane), and polyolefin and other unsaturated polymer systems. Since other resists designed for shorter wavelengths are principally polystyrene or poly(vinyl-cyclic) based, similar modifications in hydrophilicity of the surface and limited penetration should be attained with ozone treatment. These resists also have similar low surface energies as the DNQ/novolac resist. Using solubility mapping or other techniques, the appropriate solvent system can be formulated to prevent solvent intermixing in conjunction with ozonation.

The present technique utilizes a surface treatment, which advantageously does not modify the bulk dissolution properties of the resist. This allows the use of both resist systems which rely on chemically induced solubility changes from the conversion of a photosensitive component and those which rely on structural modifications of the polymer through an increase in intra-molecular bonds (crosslinking) or fragmentation of the polymer network (chain scission).

Furthermore, it should be understood from the above description that there is no unique solvent system, which can be used, in the present application. Since the individual components of the solubility parameters (i.e. polar, hydrogen-bonding, and dispersive values) are additive, a co-solvent system can be constructed relatively simply using appropriate ratios of a true solvent and non-solvent. In addition, the technique to combine solvent tailoring with surface treatment to prevent solvent penetration is not specific to one type of coating technique used in IC manufacturing. Rather, it can be applied to a variety of techniques such as spin, spray, or extrusion. The primary difference is the solvents used for each coating technique would have similar solubility parameters, but optimized volatilities and viscocities for the type of coating application used. Chlorobenzene for instance has been used as one constituent in the above description since it has physical properties well suited for spin coating. In addition, it a similar evaporation rate as PGMEA preventing changes in the ratio of each constituent during solvent evaporation. For instance, phase separation and aggregation during coating may occur if the stronger more polar solvent evaporates more quickly. Conversely, if the weaker less polar solvent evaporates more quickly, the stronger solvent may penetrate into underlayers.

Other surface treatment techniques are also within the scope of the present invention. For instance, we have found that exposing novolac surfaces to hexamethyldisilazane (HMDS) after ozonation can provide an even more resilient barrier to solvent penetration in the DNQ/novolac resist system. The region where no intermixing occurs is stretched to co-solvent systems consisting of approximately equal parts of chlorobenzene and PGMEA. On 30 mm thick films, the vacuum ultraviolet spectrum of an ozone plus trimethylsilyl functionalized film has a similar spectrum as a film which was only ozonated with possibly a slight increases in the level of aromatic cleavage and subsequent carbonyl derivative formation. No further change in the penetration depth is discernable and the treated layer is base soluble. Other surface treatment combinations with ozone are possible. Ultra-violet light can be introduced during ozonation. Throughputs for instance could possibly be increased by performing ozonation during patterning. A number of other non-ozone based surface treatment techniques which have been investigated over the years to increase the surface energy of polymers to promote adhesion are also within the scope of the present invention. For example, both low and high pressure oxygen based plasmas can be used to alter the hydrophilicity of the surface. Oxygen based plasmas react with hydrocarbon based polymer surfaces creating highly polar end groups including C—O, C=O, O—C=O, C—O—O, and $CO_3$ species. With the appropriate process parameters, the treated surface layer has been shown to be localized to approximately the top 10 nm of the surface. Chemical treatments include exposing a polymer surface to an oxidizing agent, such as hydrogen peroxide. Additionally, flame treatment, coronas, IR, UV, X-rays, γ-rays, electron and ion beam bombardment have been used to increase the surface energy of polymers. Therefore, surface modifying agents include ozone, ozone plus additional agents or energy, hydrogen peroxide, oxygen based plasmas, and other high energy photon or particle beams.

Other surface engineering techniques using self-assembled monolayer techniques are also within the scope of the present invention. For instance, the surface may be treated with a water soluble amphiphile (surfactant). The hydrophobic portion binds to the polymer surface resulting in a more polar nature of the surface from the hydrophilic contributions of the surfactant.

It should be understood that the surface layer(s) of the resist may be modified to be hydrophilic or hydrophobic dependent upon the surface modifying agent chosen. Subsequently, the solvent for the resist is chosen such that the system does not penetrate into the bulk of the previous resist layer. This can be accomplished by various iterations by treating a hydrophilic treated surface with a solvent combination that does not dissolve or penetrate a hydrophilic surface or by treating a hydrophobic surface with a solvent combination that does not dissolve or penetrate a hydrophobic surface. Hydrophobic surfaces may formed by plasma treatments with halogenated materials, e.g., fluorinated materials, or silicone containing compounds such as silanes or silyl orthoesters.

It should also be under stood that the steps of exposing layer 10 to radiant energy 100 and treating the surface 12 to ozone 50 may be reversed in the process flow for mulitlayer patterning in FIG. 1. In addition, steps may be performed concurrently in certain instances rather then solely sequentially. For instance, exposing layer 10 to radiant energy 100 may occur during the treatment of surface 12 to ozone 50. Although the presence of ultra-violet light will cause material removal in the form of volatile alcohols, simple estimates can be performed to show that the amount of material removal is nanometer scale or less for the typical exposure doses required for common photoresist materials. For resists requiring a post-exposure bake, this step can also be performed on a layer by layer basis. Different families of resists compatible with the surface treatment can also be used on individual layers. In addition, resists from the same family with different properties can be applied during the build operation. For instance, dyes are commonly added to a photoresists to create a family of materials with different optical absorptions. For regions with low azimuthal curvature, it is desirable to use a more transparent version allowing a thicker layer to be exposed at once to improve throughputs.

Variable Dose Delivery

For positive tone resists such as the DNQ/novolac resist system, the degree of solubility at a given developer normality depends on exposure dose. Since the resist is semi-transparent at the given exposure wavelength, the dissolution rate decreases with depth. If a constant exposure dose were to be used, development would proceed rapidly at the beginning of a layer, but decreases rapidly near the bottom of the level. In a multi-layer application, this can easily increase development times by orders of magnitude. Compounding this factor, positive tone resists typically have lower differentials in dissolution rates between exposed and unexposed portions compared to negative tone resists. Over the long development times expected with this multilayer resist application compared to single layer processing, this can lead to a loss of dimensional control from resist loss in unexposed portions.

Referring back to FIG. 2, variable doses are used over different portions of each layer. Portions of the part falling a specified distance from the bottom of the structure on each layer receive higher doses (denoted 220, 230,240). In this manner, development proceeds more rapidly from the interior emanating outwards. Steps are outlined below to divide a layer 21–24 into appropriate regions receiving different doses to achieve accurate lateral and depth control. The procedure requires several calculations to be performed. These include the capability of returning cross-sectional representations of the structure, defining perimeter locations within the layers at a given location in depth, and comparing perimeter locations between two layers. Typically, this will be performed using solid modeling software. All of the above data processing requirements can for instance be implemented using standard primitive commands in AutoCAD® from AutoDesk®, Inc. In addition, the ability to calculate the exposure dose and concentration of photoactive components (PAC) within a layer as well as total accumulated dose leaking into previously coated layers is required. Extensive literature exists on optical/resist models and in addition sophisticated software (such as Prolith™ from Finle Technologies, Inc.) is commercially available for calculating the exposure dose and photoactive component distribution. For instance, C. A. Mack, "Optical Lithography Modelling," in *Microlighography: Science and Technology*, edited by J. R. Sheats and B. W. Smith (Marcel Dekker, Inc., New York, 1998), ch. 2, outlines the basic details of an optical/resist processing model. S. V. Babu and E. Barouch, "Exact solution of Dill's Model Equations for Positive Photoresists Kinetics," (IEEE Electron Device Letters EDL-7, 252,1986) gives an analytical expression for calculating the PAC concentration formed in positive photoresists which can be applied to calculating light leakage between layers.

Figure 10:
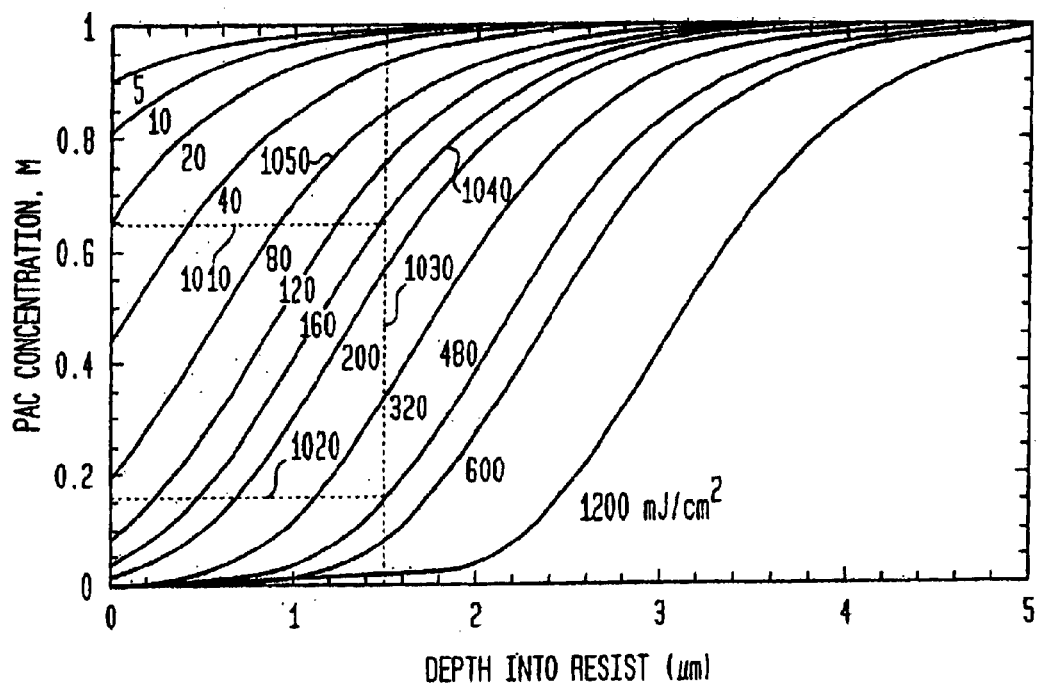
FIG. 10 is a graphical representation for the calculation of PAC concentration distribution as a function of dosing for a DNQ/novolac resist.

To determine the appropriate exposure dose, the first step is to determine the relationship between exposure dose and distribution of photogenerated species. This is typically performed using the method first presented by Dill et al. (F. H. Dill, W. P. Homberger, P. S. Hauge, and J. M. Shaw, "Characterization of positive photoresist," IEEE Trans. Elect. Dev. ED-22, 445,1975). First order kinetics are used to model the photochemical exposure. In novolac resists, the decomposition of photoactive component of the resist to base soluble products as a function of position into the resist, z, and time, t, is given by the differential equation:

$$\partial M(z,t)/\partial t = -CI(z,t)M(z,t) \quad (1)$$

where M is the fraction of PAC, and C is the efficiency at which PAC is converted per unit dose. The intensity, I(z,t), is given by Beer's Law as a function of position and time and is given by the differential equation:

$$\partial I(z,t)/\partial z = -(AM(z,t)+B)I(z,t) \quad (2)$$

where A is the difference in absorption between unexposed and photodecomposed PAC, and B is the absorption of the matrix resin of the resist and photodecomposed PAC. During exposure, the DNQ sensitizer is converted to base soluble carboxylic acid. These two materials have different absorbencies in the NUV which is incorporated in the first product term in Equation 2. Values for A, B, and C can be determined by monitoring the change in transmission of a thin film or photoresist on a transparent substrate following the technique presented by Dill et al. at the exposure wavelength. Once determined, the PAC concentration is calculated by solving the differential equations for the appropriate initial and boundary conditions for the system. FIG. 10 shows a representative PAC distribution as a function of depth at varying incident doses in Shipley S1800 DNQ/novolac resist using a 325 nm radiant energy source. The calculated profiles are for an infinitely thick layer of resist or a thick layer of resist on an index matching substrate such that surface reflections do not alter the boundary conditions at the resist-substrate interface. The experimentally determined Dill parameters using a focussed HeCd laser operating at 325 nm are A=0.893 microns$^{-1}$ B=0.911 microns$^{-1}$, and C=0.02077 cm$^2$/mJ.

Figure 11:
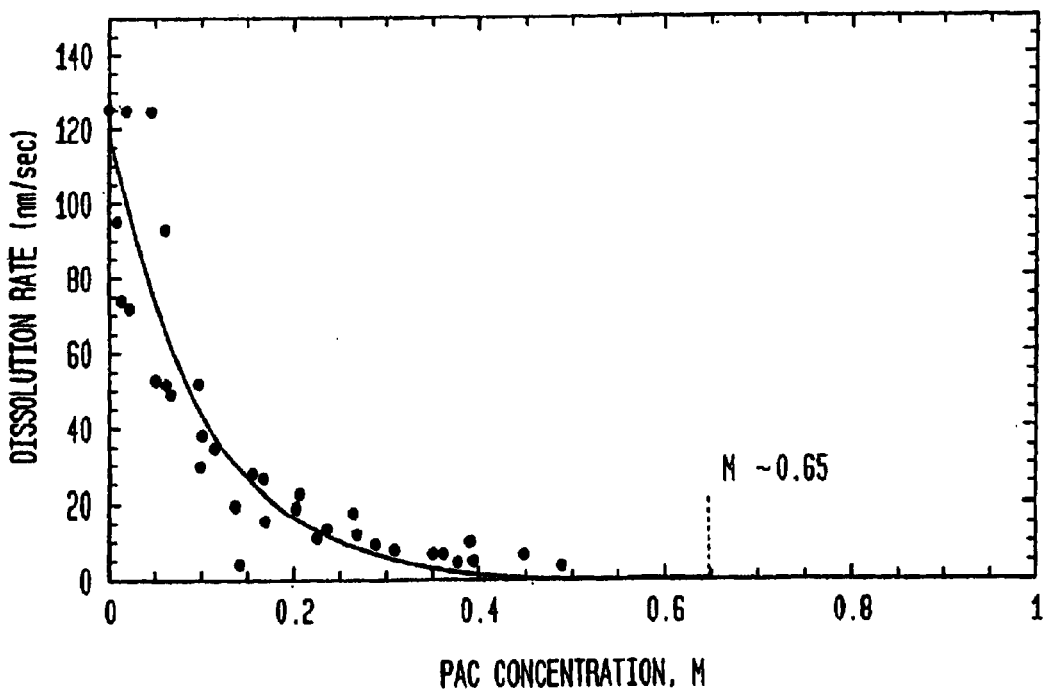
FIG. 11 is a graphical representation of the dissolution rate of a DNQ/novolac photoresist developed in 0.175 N potassium hydroxide developer as a function of PAC concentration.

After the relationship between dose and PAC distribution is adequately represented, the second step in determining the required exposure dose mapping in a layer is to determine the dissolution rate of the resist as a function of PAC concentration. This is necessary to determine the critical concentration of converted PAC at which development ceases. Since the PAC distribution varies through the film due to attenuation of the source, rate data during development is necessary. The rate data can be correlated with the predicted PAC distribution calculated from Equations 1 and 2 to determine the dissolution rate as a function of PAC concentration. Commercially available equipment exists to interferometrically monitor the dissolution rate as a function of depth into the resist. Alternatively, several substrates containing exposure dose arrays can be subjected to different development times and the rates then calculated from the measured thickness loss. FIG. 11 shows a typical example of the dissolution rate as a function of PAC concentration in 0.175 N KOH developer based on experimental data for Shipley S1800 DNQ/novolac resist reconstituted in 4 parts chlorobenzene to 1 part PGMEA. The reconstitution was performed by evaporating out a portion of the solvent for the resist, PGMEA, and adding the appropriate amount of chlorobenzene. At this developer concentration, it has been found that development ceases at a relative PAC concentration of ~0.65. A slightly lower developer normality has been used compared to the levels conventionally used in single layer processing (i.e. 0.26 N) to reduce the background resist loss rate to negligible levels.

Given the Dill parameters, the known reaction and thermal kinetics of the photoresist process, and the experimentally determined dissolution characteristics for a given developer concentration, the necessary exposure doses to optimize the development process can be determined. A critical dose, $E_d$, is defined representing the dose at which development would cease at the specified layer thickness, d. For instance, for a target layer thickness of 1.5 $\mu$m, the critical dose can be determined numerically from equations 1 and 2. Alternatively, the value can be determined graphically in FIG. 10 by locating the contour which intersects the segments 1010 and 1030 at point (d,MC$_{crit}$). For the DNQ/novolac resist system being considered, an exposure dose approximately equal to 160 mJ/cm$^2$ (trace 1040) is sufficient to cause development to cease after 1.5 $\mu$m in 0.175 N KOH. In portions of layer where development should stop at the bottom of the layer, the total accumulated dose from all subsequent exposures at the bottom of the layer must equal this critical dose. The total dose includes the exposure dose, $E_{exp}$, for that layer plus light leakage, $E_{leak}$, from subsequent exposures on overlayers. In patterned regions extending over multiple layer thicknesses, higher doses are used. The light penetration between layers only adds to PAC conversion increasing the development rate. The maximum dose used however must not cause energy leakage to exceed $E_d$ over a portion of a layer where development must cease at the bottom of the layer.

The following set of simple rules formalizes the procedure to maintain accurate depth control and account for light leakage. The general formula for light leakage for layer n from overlayers n+1, n+2, n+3, . . . can be calculated from the Dill equations by summing the energy which is transmitted to layer n such as layer 21 from subsequent exposures at layers n+1, n+2, n+3, . . . (i.e. layers 22, 23, 24, . . . ). Since equation 1 and 2 are linear first-order differential equations, the light leakage at layer n can be expressed as a summation of the individual leakage contributions from each subsequent dose in overlayers. Assuming constant layer thickness, the light leakage into layer n, $E_{leak}^n$, at arbitrary position x,y in the plane of the resist is equal to:

$$E_{leak}^n(0)=E_{exp}^{n+1}(d)+E_{exp}^{n+2}(2d)+E_{exp}^{n+3}(3d)+\ldots \quad (3)$$

where $E_{exp}$ (Z) is the exposure dose used on each layer, i, at position x,y. The variable z represents the distance referenced from the top of the layer i into the resist (i.e. incremental rather than absolute coordinates for the system). The summation extends until each additional term adds a negligible contribution compared to the critical exposure dose. In practice, only a few layers need be considered due to attenuation of the beam within each layer. Also, for layers near the top, only terms where overlayers exist are included in the summation.

The Dill equations can be used to determine each term in the general formula for leakage allowing iterative solution of self consistent doses for each layer. However, the assignment of doses is simplified by viewing the system from the path of development which starts at top layer 30 progressing downwards through 20 and 10 rather than from the path of exposure which occurs in the reverse fashion. As will be shown by demonstration, starting from the exposure at the last exposed layer (30), a small subset of doses can be determined which can be used for all portions of a layer. The same procedure can in effect be applied to all subsequent layer pairs, in effect, limiting the summation term in equation (3) to the first term. Table 1 formalizes these rules. In assigning the appropriate doses, interior portions (column 3, Table 1) are defined as portions of the layer where the layer directly below is also exposed. Portions where the structure terminates at the bottom of the is layer (column 2, Table 1) are defined by subtracting the region defined in the layer below from the current layer.

TABLE 1

Exposure dose requirements for individual layers

| Layer | At a given position x,y in layer n, the structure terminates at the bottom of the layer | At a given position x,y in layer n, the layer below is exposed (interior portions). |
|---|---|---|
| Top Layer(TL) | $E_d$ | $E_{exp}^{TL}(0)$ such that $E_{exp}^{TL}(d) \leq E_d$ |
| Top Layer − 1 (TL − 1) | $E_d - E_{exp}^{TL}(d)$ | $E_{exp}^{TL}(0) - E_{exp}^{TL}(d)$ |
| Intermediate | $E_d - E_{exp}^{TL}(d)$ | $E_{exp}^{TL}(0) - E_{exp}^{TL}(d)$ |
| Bottom | $E_d - E_{exp}^{TL}(d)$ | — |

Figure 12A:
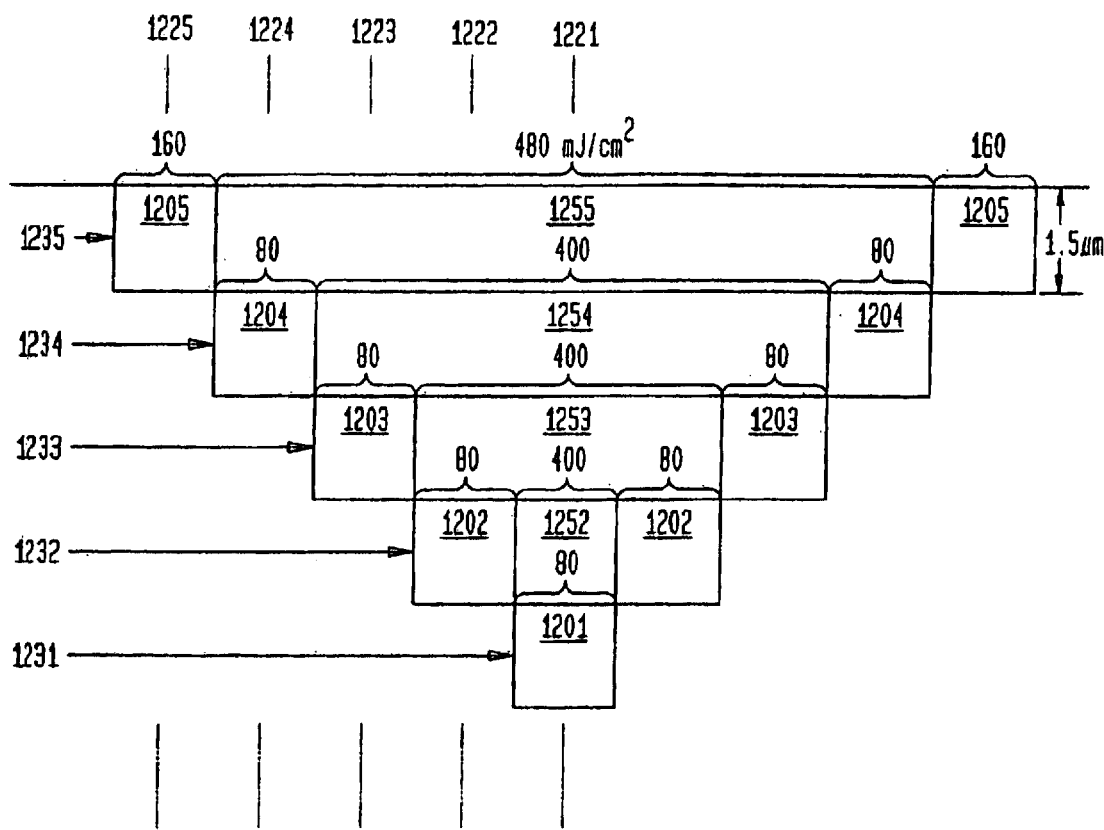
FIG. 12A shows a graphical representation of doses used to pattern a staircase structure using the procedures outlined in the embodiments of the invention.
Figure 12B:
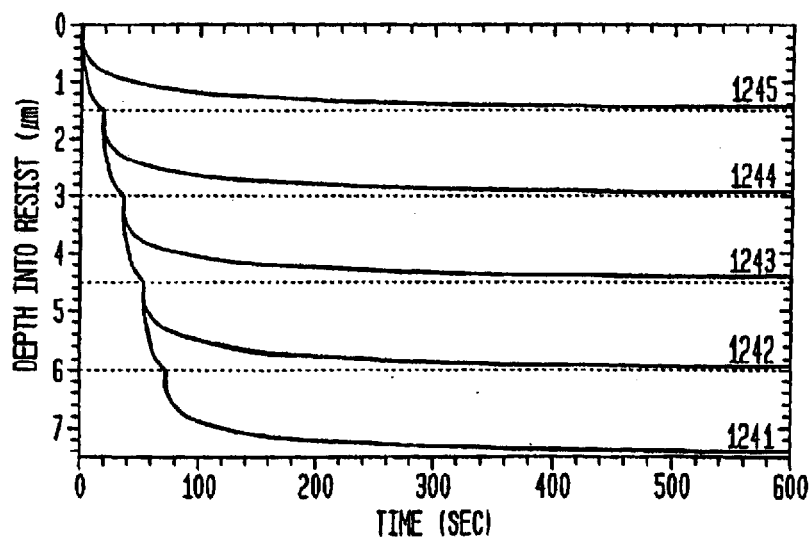
FIG. 12B shows a graphical representation of the predicted time evolution of the propagating resist front during development over the steps of the staircase structure.

The procedure is illustrated for a staircase structure with 1.5 $\mu$m step heights as shown in FIG. 12a. using the PAC concentration and dissolution rate distributions in FIGS. 10 and 11. It is assumed the films are spun on an index matching substrate so that surface reflections do not alter the PAC distributions shown. The critical dose to stop development is 160 mJ/cm$^2$ in 0.175 N developer. A total exposure dose of 480 mJ/cm$^2$ is chosen in portions of a layer over previously exposed layers. As shown graphically in FIG. 10, the PAC concentration varies between about 0 at the top of the layer to about 0.2 at the bottom of the layer directly over the exposure (segment 1020). The total development time through the first 1.5 $\mu$m can be determined by integrating the corresponding dissolution rate over the calculated PAC distribution. The resulting value in 0.175 N KOH developer is approximately 20 seconds compared to roughly 10 minutes over portions were the critical dose of 160 mJ/cm$^2$ is used. Light leakage for a dose of 480 mJ/cm$^2$ can be calculate numerically or determined graphically in FIG. 10 by locating the contour which intersects segment 1020 on the vertical axis. Trace 1050 nearly interects segment 120 resulting in a leakage current of approximately 80 mJ/cm$^2$. The value of the leakage current is less than the critical dose as required. Exposure doses are assigned accordingly to produce total doses of 160 mJ/cm$^2$ and 480 mJ/cm$^2$ in the appropriate regions on each layer accounting for the 80 mJ/cm$^2$ of interlayer light leakage. The dose used over the interior portion 1254 is 400 mJ/cm$^2$. When combined with the 80 mJ/cm$^2$ of leakage exposure energy from the exposure of layer 1235 over interior section 1255, the total dose at the surface of interior portion 1254 is 480 mJ/cm$^2$, the same as at the top surface of layer 1235 in interior portion 1255. The process continues downwards. The dose at the surface of interior portion 1253 on layer 1233 also receives a dose of 400 mJ/cm$^2$. Only the leakage term from the dose on the previous layer (1234) has to be considered since the exposure dose on the previous layer (1234) encompasses the leakage dose from its own previous layer (1235) in a linear system. Portions on a layer where the structure terminates such as portions 1205, 1204, 1203, 1202, and 1201 receive the necessary dose to produce a total dose of the 160 mJ/cm$^2$, the critical dose for development to cease at the bottom of the layer. FIG. 12b also shows the predicted evolution of the resist front along axes 1221, 1222, 1223, 1224, and 1225 during development. Traces 1245, 1244, 1243, 1242, and 1241 coorespond to axes 1225, 1224, 1223, 1222, and 1221 respectively. The total time for development is significantly faster than if a constant dose of 160 mJ/cm$^2$ were used for each layer. In this case, development would proceeded rapidly at the beginning of a layer 1235 but decrease rapidly near the bottom on the layer. The total development time would be the time required to develop through the first layer 1235, as shown in trace 1245, times the total number of layers.

Figure 12C:
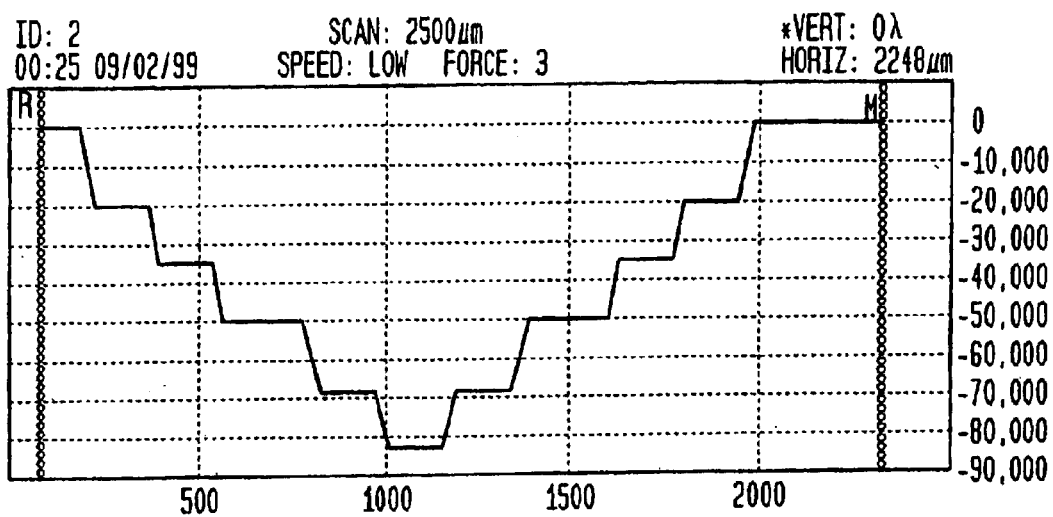
FIG. 12C shows a surface profile measurement of a five layer structure patterned in DNQ/novolac resist using the procedures outlined in the embodiments of the invention.
Figure 12D:
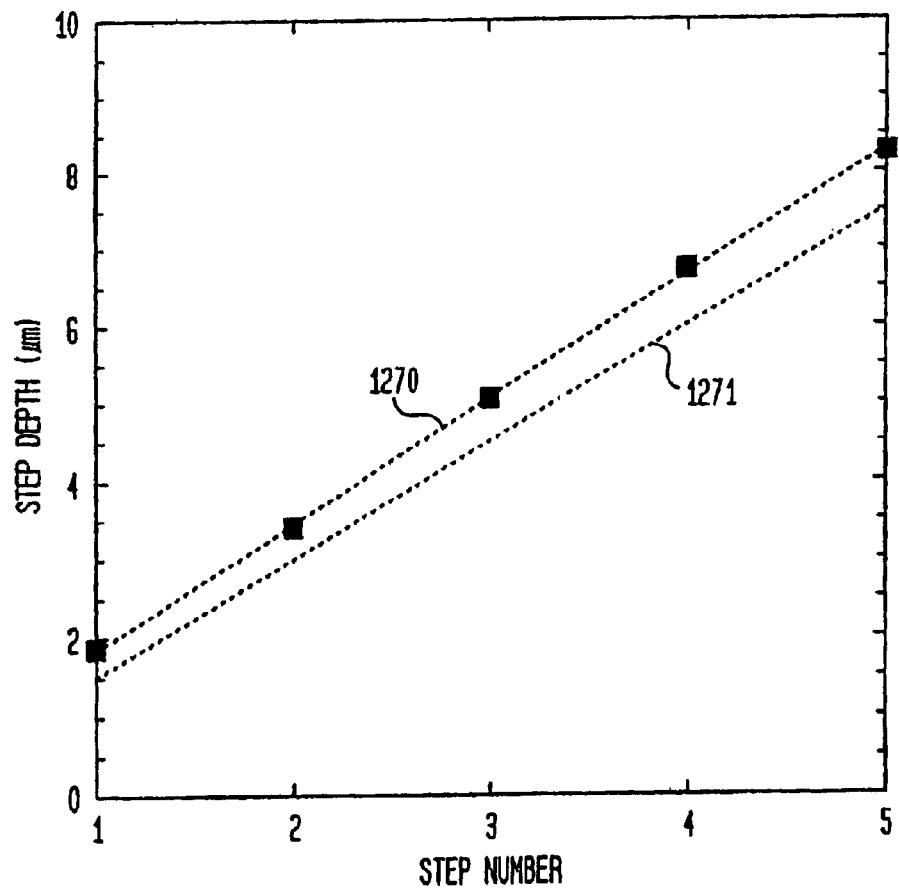
FIG. 12D shows a graphical representation comparing the average step height of the patterned structure in 12C with the predicted values.

FIG. 12c shows the surface profile measurement of a five staircase structure patterned in DNQ/novolac resist using the dose assignments in FIG. 12a. Each step is approximately 250 microns across by 1.5 microns deep. Shipley 1800 series photoresist was reformulated in a co-solvent mixture of 4 parts chlorobenzene to 1 part PGMEA. Spin coating was used to apply each layer of photoresist. A one minute post-apply-bake at 100° C. was used to drive out residual solvent after each coating. Portions of each layer were patterned with a vector base laser scanning system using a 8 mW/cm$^2$ HeCd laser operating at 325 nm as the source. The focused spot size was approximately 4 $\mu$m and the beam was swept at a scanning speed of 5 cm/s. The incremental line spacing between scans was 2 $\mu$m. An electro-optic shutter was used for intensity modulation. Pins placed into the wafer chuck holding the substrate in the exposure system were used for registration after each new coat was applied. After exposure to radiant energy 100, surfaces were treated with ozone (50) at concentrations of approximately 1 to 2% for 1 minute. The part was developed in 0.175 N KOH developer for approximately 15 minutes and subsequently rinsed in de-ionized water. Step height measurements were performed with a Dektac Surface Profilometer from Veeco Instruments. FIG. 12d compares the average step height (trace 1270) with the predicted values (trace 1271). The results demonstrate within the experimental errors of our setup, depth control could be maintained using interlayer dose modulation techniques.

It should be understood there is no unique set of doses that can be used on each layer. Nor does every layer have to be patterned even over interior portions. Throughputs could possibly be improved by exposing every second or more layer in interior portions if sufficient power is available. Also, the dose modulation scheme can be performed on re-entrant structures by adjusting the definition of the top layer to be any exposed portion of a layer with no exposure directly over it. All that is required is a path for developer to reach the exposed portions. Clearly, if significant restrictions to the flow of developer exist, more extensive two or three-dimensional simulations would have to be performed to account for mass transport limitations. Also, for simplicity, the description has been framed to terminate development at discrete levels defined by the individual coating layers. The results can be generalized in a straightforward manner for the case where it is required for development to stop within a layer.

It should be understood that variable dose control over each individual layer is not specific to the DNQ/novolac resist system and can be applied to other positive tone resists. Acid catalyzed resists requiring thermal activation are also treated in a similar fashion following first order linear differential equations 1 and 2 and using Dill ABC parameters. Thermal degradation and additional activation of solubility changes during the build can be included by incorporating temperature dependent Dill parameters. Thermal diffusion can also be included by solving the mass transport diffusion equation based on the thermal history of each layer. In these instances, the thermal history of each layer would have to be calculated. The simplest case occurs when thermal degradation, diffusion, and additional activity of solubility changes during bake out steps are negligible. In addition, the procedure for dose modulation is not specific to a type of development used such as immersion, spin, spray, or interrupted.

Stereolithographic Patterning with Variable Size Exposure Areas

There are three primary maskless based optical patterning techniques: vector-based laser scanning systems, projection systems using a spatial light modulator, and raster scanning laser systems. In vector-based laser scanning systems, a focussed laser beam can be scanned across the surface in an arbitrary fashion Compared to the other methods, they are typically simpler and more cost effective to produce. However, unlike the projection or raster based techniques, the patterning times are dependent on the layer geometry. For microscale patterning, scanning rate rather than source power will also typically limit throughput due to the high power density gains achieved when focusing even modest power laser to micrometer scale spots. To reduce patterning times, an algorithm is presented for modulating the spot size of the focused laser beam to more efficiently pattern portions of the interior. Critical portions of the structure (321) at the perimeter are patterned at high resolutions. A sufficiently large transition region 322 is also patterned at high resolutions allowing coarser resolutions to be used within portions of the interior without impacting critical regions. The technique relies on the fact that the actual intensity distribution within the transition region and remaining portions in the interior do not have to be as accurately controlled as long as the total dose is sufficient for rapid development. The technique vastly simplifies the stitching of non-rectangular beams with lateral variations in intensity and relaxes the tolerances on alignment between different size beams. This technique can be used on both positive and negative tone resists to efficiently cover broad areas.

Extensive literature exists for describing the basic design and capabilities of vector-scan based laser systems. The ability to modulate the spot-size of the laser beam and incident laser power are two additional requirement of the exposure tool for implementing the spot-size modulation algorithm. Changing the divergence of the laser beam at the input of the focusing optic is one such method of varying the spot size. Details for calculating the resulting spot-size can be derived from the analysis presented in Quanitum Electronics, A. Yariv (Wiley, New York, 1989 pg.119–123). Dose control can be achieved with a suitable modulator such as an electro-optic shutter for continuous wave sources or pulse counting in conjunction with attenuators with pulsed lasers. It is also envisioned some form of beam profiling across the scan field is present for characterizing the spot diameter and mapping distortions within the scanning field. This is often performed by scanning the beam over a reflective pattern in the focal plane of the focusing optic. By monitoring the reflected beam off of the surface, spot diameters and field distortions can be determined.

Figure 13:
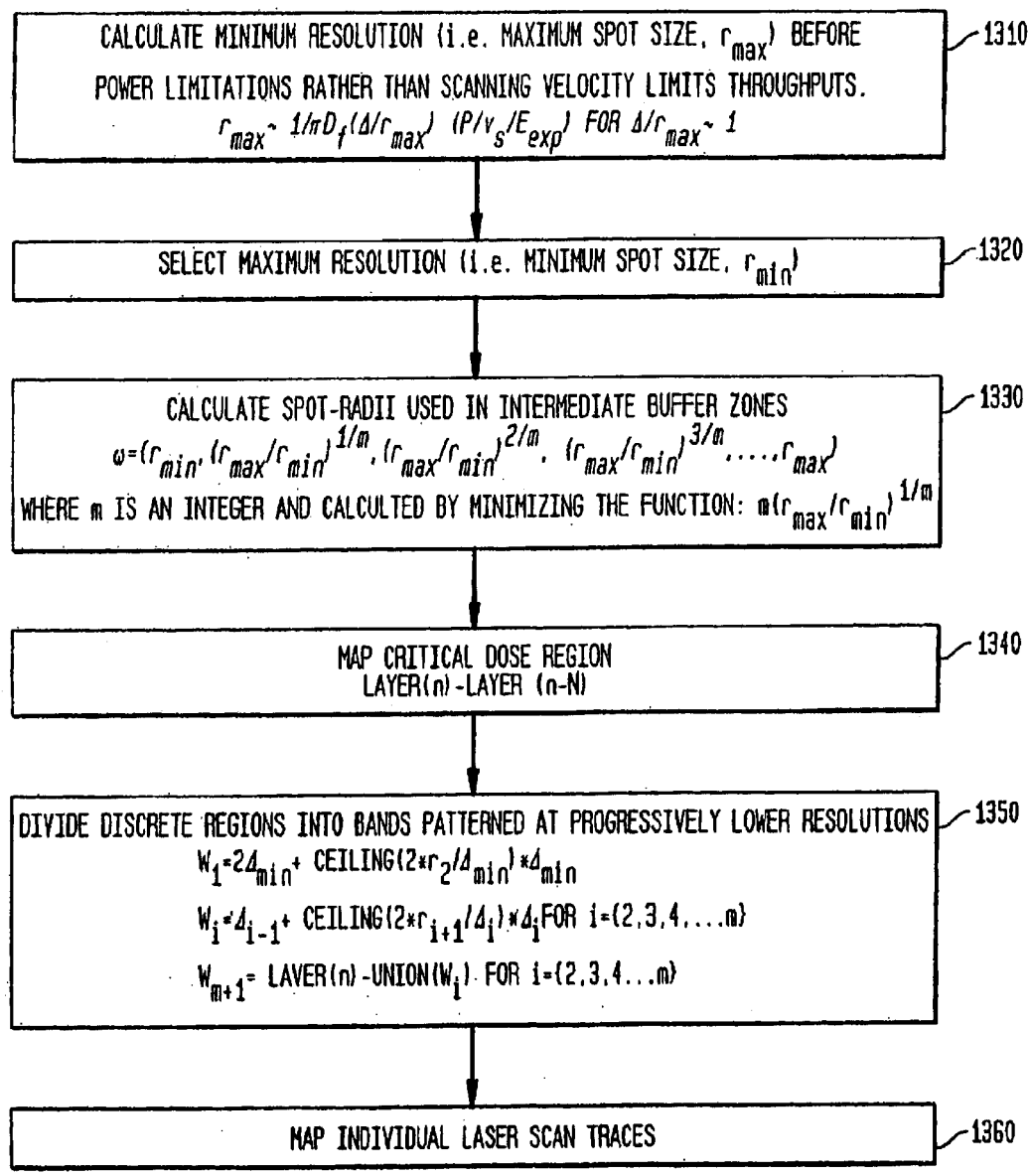
FIG. 13 is a flow chart for a spot size modulation algorithm in accordance with an embodiment.

The spot-size modulation algorithm is designed to minimize the total number of laser scans used to pattern each discrete region within a layer. The algorithm defines a procedure to subdivide a discrete region into coencentric bands (321,322,330,340, and 350) which appear similar to elevation plots. However instead of each contour representing a constant elevation, the edges of each band represent the locus of points a fixed offset from the perimeter. The bands provide a controlled means to transition from high resolutions at the perimeter of the part to coarser resolutions in the interior without effecting the edge definition of the structure. A flow-chart summarizing the algorithm is shown in FIG. 13. To effectively perform the algorithm, it is envisioned solid modeling software is used to represent the part. In addition, the solid modeler is capable of performing simple Boolean operations, defining scaled internal boarders which are a specified distance from the perimeter of the part, and performing edge (i.e. perimeter) extraction of a region and conversely defining a region (or area) from an edge. These are for instance primitive commands in AutoCAD.

Figure 14A:
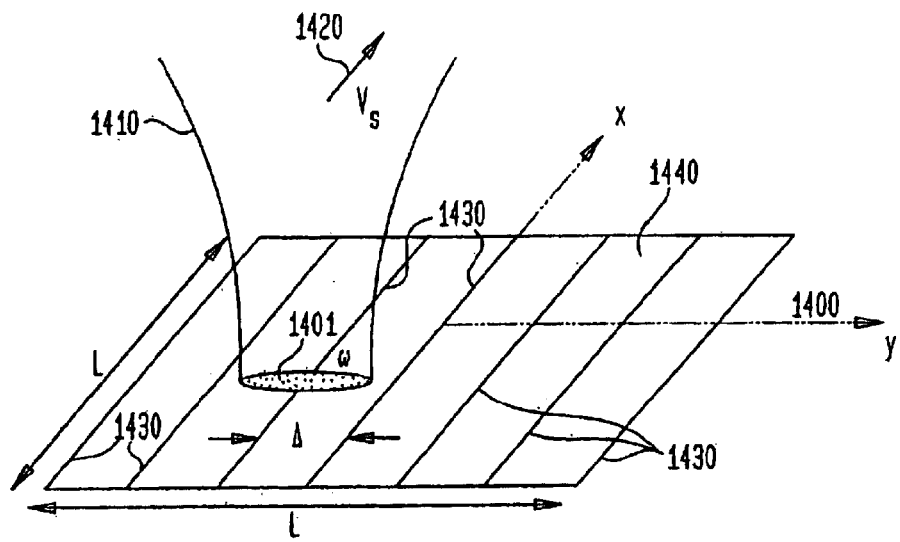
FIG. 14A depicts a coordinate system of a scanning laser beam.

The first step of the algorithm 1310 is to calculate the largest spot-size (i.e. lowest resolution) which can be used for interior points at which point power density limitations rather than scanning speed limits throughput. At this point, there is no additional benefit with reducing the patterning resolution further. To determine the maximum spot-radius, $r_{max}$, the first step is to calculate the functional dependence of exposure dose with laser power and intensity distribution, scanning velocity, and incremental line-spacing between laser scans. Below, the derivation is illustrated for a focused laser beam (1410) with a Gaussian intensity distribution (see FIG. 14a). It is assumed that the laser beam with spot radius $\omega$ is scanned across a surface (1440) over a region of length L in the x direction at velocity $v_s$ (1420) and incrementally moved between line scans (1430) in the y-direction an incremental spacing, $\Delta$, as shown in FIG. 14a. The results from the derivation closely match results for a laser beam scanned in a curvilinear fashion when the radius of curvature of the path is large compared to the spot-size of the laser beam. This will generally be the case for contiguous objects. Thus the chosen geometry is used for convenience. (In situations were this is not the case, much more extensive optical proximity correction techniques are required and are discussed later.) For a focused Gaussian laser beam, the intensity distribution is given by:

$$I = I_o e^{-2\left(\sqrt{x^2+y^2}/\omega\right)^2} \quad (4)$$

where $I_o$ is the peak intensity at (x,y)=(0,0) and $\omega$ is the radius of the focused laser beam. It can be related to the source power, P, by integrating the intensity distribution over all space and is given by the expression:

$$I_o = 2P/(\pi\omega^2) \quad (5)$$

Figure 14B:
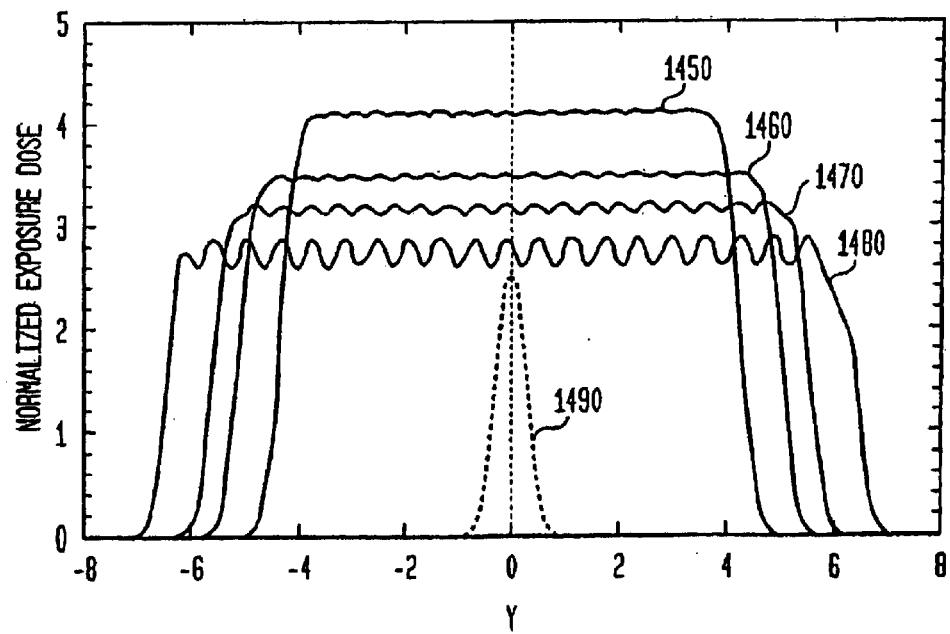
FIG. 14B shows a graphical representation of the calculated exposure dose along the y-axis for various values of incremental line spacing, Δ, for a 0.5 micron radius focused laser beam scanned a total of 21 times across the surface.

The total exposure dose, $E_{exp}$, at any point x,y in the field can be expressed as:

$$E_{exp}(x, y) = \sum_{i=-l^*NL}^{NR} \int_{-L/2v_s}^{L/2v_s} I_o e^{-2\left(\sqrt{(x-v_s t)^2+(y-i\Delta)^2}/\omega\right)^2} dt \quad (6)$$

where NL equals the number of scans to the left and NR equals the number of scans to the right. The integration term represents the contribution from an individual line scan as the laser beam scans a line (1430) in the x direction while the summation term adds the contributions from each line scan. FIG. 14b shows how the exposure energy calculated by equations 6 changes along the y-axis as the incremental line spacing is varied for a 0.5 $\mu$m radius beam scanned over 21 line scans for the case where L>>$\omega$. The incremental line spacing to spot radius is 0.771, 0.908, 1.00, and 1.157 in traces 1450, 1460, 1470, and 1480 respectively. Trace 1490 shows the exposure distribution for a single line scan (1430) along the y axis. The ratio of incremental distance to spot radius determines the total dose uniformity. An average roughness term, $R_a$, for the ripple can be calculated by comparing the exposure dose at the peaks and valleys in traces 1450, 1460, 1470, and 1480. $R_a$ is defined as:

$$R_a = \frac{E_{exp}(0, 0) - E_{exp}(0, \Delta/2)}{\frac{1}{2}[E_{exp}(0, 0) + E_{exp}(0, \Delta/2)]} \quad (7)$$

Table 2 lists the associated errors as the incremental line spacing is varied. Roughness values can be maintained on the order of 1% by incrementally moving the beam between line scans on the order of the beam radius.

TABLE 2

Roughness and Spacing Factor values
for various ratios of incremental line spacing, $\Delta$, to spot-radius.

| $\Delta/\omega$ | $R_a$ error | Spacing factor, $D_f(\Delta/\omega)$ | $r_{max}$ |
|---|---|---|---|
| 0.771 | 0.1% | 3.90 | 121 $\mu$m |
| 0.908 | 1% | 3.38 | 105 $\mu$m |
| 1.000 | 2.8% | 3.07 | 95 $\mu$m |
| 1.157 | 10% | 2.68 | 83 $\mu$m |

The value of $R_a$ in equation 7 was calculated at the central portion of the rectangular region. In general though, the roughness term holds over the entire region within approximately two spot radii from the edge. Due to the exponential fall off in intensity for a laser beam with a Gaussian energy distribution, within approximately two beam radii from the center of the beam, the intensity has fallen by a factor of Exp[$-2$ $(2)^2$]=0.0003. Both the limits of integration and summation term in equation 6 can therefore be taken over a reduced region independent of location within the interior section without significantly altering the calculation of the total dose. The effective dose can be approximated by the following simplified expression.

$$E_{exp}(x, y) \sim \sqrt{2\pi} \sum_{i=-l}^{l} e^{-2(i\Delta/\omega+\Delta/4)^2} \frac{P}{\pi\omega^2} \frac{1}{v_s/\omega} \sim D_f(\Delta/\omega) \frac{P}{\pi\omega^2} \frac{1}{v_s/\omega} \quad (8)$$

The first factor, $D_f(\Delta/\omega)$, is a function of the ratio of the incremental line spacing with spot radius and in effect relates the degree of overlap of the scans to the total integrated dose at a given point. It typically ranges between 3 to 4 for incremental line spacings on the order of the spot radius (see column 3 in Table 2). The second term in equation 8 is the power density of the focused laser beam. The third term is the residence time, or effective dwell time of the beam, as it transverses the surface at any given point.

The maximum spot size in the algorithm (1310) can then be calculated at which sufficient laser power exists to impart the necessary exposure dose without reducing the laser scanning rate from its peak closed-loop velocity. It is given by the expression:

$$r_{max} \leq \frac{1}{\pi} D_f(\Delta/r_{max}) \frac{P/v_s}{E_{exp}} \sim \frac{P/v_s}{E_{exp}} \text{ for } \Delta/r_{max} \sim 1 \quad (9)$$

where a value of $\Delta/r_{max}$ is chosen which fits within the available error tolerances of the process. For instance, the fourth column in Table 2 lists the largest spot-size (diameter) which can be used assuming the exposure dose is 480 mJ/cm$^2$ using a HeCd laser source operating at 325 nm. The scanning lens is assumed to be a 30 mm focal length lens with 12.5 mm pupil fill, and diffraction limited performance for angular deviations +/−10 degrees off axis. The closed loop bandwidth of the galvanometers is assumed to be 1 rad/s. The above conditions enable a 1-$\mu$m spot-size (0.5-$\mu$m radius) laser beam to be scanned over a 1 cm field at up to 3 cm/s. Even for a modest power laser source operating at 10 mWatt and assuming an 75% optical efficiency of the scanning system, power density begins to limit throughputs when the laser beam spot diameter is approximately 100 micrometers (spot radius 50 micrometers). Both a 1.0-$\mu$m and 100-$\mu$m diameter laser beam can therefore be scanned over the surface at the same scanning velocity. Argon-ion lasers operating in the NUV can achieve several orders of magnitude higher powers enabling significantly larger spots to be used.

After the maximum spot-size for patterning interior portions of a layer is determined a minimum spot radius, $r_{min}$, is chosen (1320) to pattern the critical dose region 321. The value of $r_{min}$ will define the ultimate lateral resolution of the process and under most circumstances will be the diffraction limited spot radius of the optical system at best focus. The next step (1330) is to define a sequence of different spot sizes for patterning each discrete region (321, 322, 330, 340, and 350) on a layer while optimizing patterning throughputs. In each discrete region of a layer, a critical dose region 321 will be defined which is patterned at the highest resolution. This region extends inwards from the perimeter over portions where accurate dose control is required to compensate for light penetration into underlayers. Remaining portions within the interior are subdivided into coencentric bands (322, 330, 340, and 350). Each band is patterned at progressively lower resolutions. The thickness of the bands are determined such that progressively lower resolutions can be used without altering the exposure dose in critical regions. From the previous discussion, the boarder of the area patterned with the coarsest beam size, $r_{max}$, must be approximately 2 spot radii from the inner edge of the critical dose region (323). At this range, the energy in the Gaussian tail has fallen sufficiently to have negligible impact on the exposure dose in the critical dose region. A transitional or buffer zone must therefore be patterned between the critical dose region and the area which can safely be patterned at the coarsest resolution. Rather than patterning the entire buffer zone at the highest resolution (i.e. $r_{min}$), the number of laser scans can be reduced by patterning a portion of this buffer zone at an intermediate spot-size between $r_{min}$ and $r_{max}$. The path of the focused beam with this intermediate beam size again must generally be at least approximately 2 to 3 spot radii from the interior edge (323) of critical dose regions. However, since its spot radius is smaller than the coarsest beam, in effect the portion of the transition zone which would have to be patterned at the highest resolution is reduced. This process of defining a new intermediate spot-sizes and bands to reduce the transition area 322 which would otherwise be patterned at the highest resolution can be continued. Although areas are, involved, the procedure is similar to the steps performed to convert a number from one base to another. In this instance the actual ratio of spacing (or base in the above analogy) can be chosen to minimize the total number of scans The spot size is increased from the minimum to maximum value by factors of the ratio:

$$(r_{max}/r_{min})^{1/m} \tag{10a}$$

where m is an integer. The value of m is determined by minimizing the function:

$$m(r_{max}/r_{min})^{1/m} \tag{10b}$$

for integer m. For instance, if $r_{min}$=0.5 micrometers and $r_{max}$=47.5 micrometers, equation 10b is minimized for m equal to 5 corresponding to the following set of spot radii:

$$\omega = r_{min}(r_{max}/r_{min})^{(i-1)/m} \text{ for } i=\{1, 2, \ldots, m+1\}=\{0.5, 1.24, 3.1, 7.68, 19.1, 47.5\}=\{r_{min}, r_2, r_3, r_4, r_5, r_{max}\} \tag{11.a}$$

Each zone has in addition an associated incremental line spacing:

$$\{\Delta_{min}, \Delta_2, \Delta_3, \Delta_4, \Delta_5, \Delta_{max}\} \tag{11.b}$$

After the spot sizes are chosen (1330), the next step in the spot-size modulation algorithm is to identify the critical dose region of each discrete portion of the layer which is patterned at the highest resolution, $r_{min}$ (1340). The critical dose region, 321, extends from the perimeter over portions where light penetration into underlayers must be controlled to maintain accurate depth control. Outside this region, the dose only has to be sufficiently high for development to proceed rapidly in positive tone resists. The critical dose region is determined by subtracting the region defining the closest underlayer where negligible light leakage occurs from the region defining the current layer:

$$\text{Critical region} = \text{layer}(n) - \text{layer}(n-N) \tag{12}$$

In equation 12, n is the current layer and N is the first term in equation 3 which can be neglected in the summation within the desired error tolerances. Equation 12 represents the region of the current layer where the dose does not have to be accurately controlled since it will not impact any perimeter (both laterally and in depth) of previously patterned layers. This relaxes the constraints on the absolute spot-sizes and field placement of the coarser beams.

After the critical region is defined, the next step in the spot-size modulation algorithm is to divide discrete regions into bands patterned at progressively lower resolutions and to determine the mapping of the each laser scan trace (1350 and 1360). The following general guidelines can be used in determining the banding and individual laser scan traces in a layer:

1. The laser beam is scanned following the contour or outline of the part. Additional scans proceed in a similar fashion following the contour of the part but offset from the perimeter a specified distance. The incremental distance between laser beam scans is determined by the spot-sizes used and dose uniformity requirements necessitated by the stated error tolerances.
2. The highest resolution beam, $r_{min}$, is used in critical dose regions (321). The laser beam is continually stepped inwards after each encirclement until the entire critical dose region is patterned.
3. The highest resolution beam, $r_{min}$, is further stepped inwards after each encirclement to provide a transitional buffer zone. This transitional zone is sufficiently wide so that the laser beam spot-size can be adjusted to the next largest value without altering the exposure dose in the critical dose region.
4. The spot-size is increased and the beam is continually stepped inwards after each encirclement to again provide buffer zones. These intermediate zones (330 and 340) are sufficiently wide so that the laser beam spot-size can be adjusted to the next largest value without altering the exposure dose in the previously patterned adjacent band.
5. Step 4 is repeated until either the entire discrete region has been patterned, or the next spot-radius is $r_{max}$. In the former case, the remaining coarse zone (350) is patterned at the coarsest resolution, again following the contour of the part.
6. The exposure energy of each trace is adjusted to smooth out the energy distribution.

Further details and the methods to apply these rules are described below.

Figure 15A:
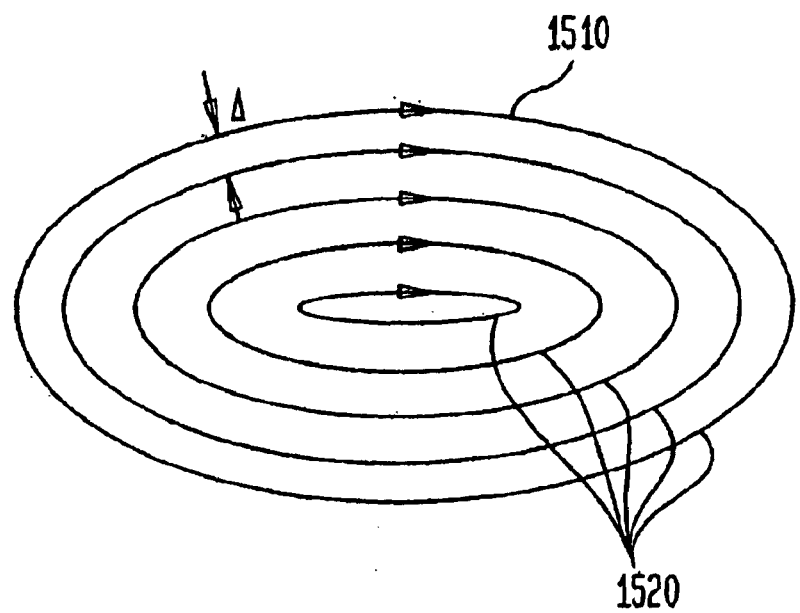
FIGS. 15A and 15B depict a scanning procedure in accordance with an embodiment.
Figure 15B:
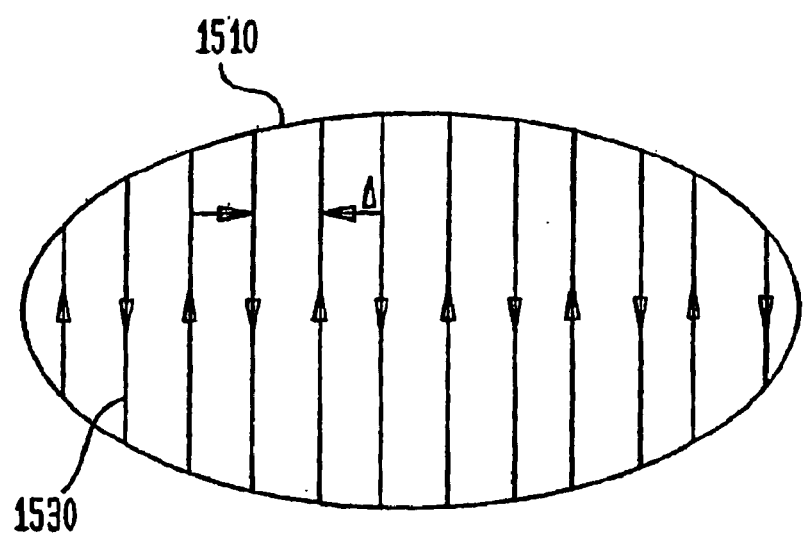

As part of the spot-size modulation algorithm, the laser beam is scanned following the contour of the part rather than in a serpentine fashion. As shown in FIG. 15, for the oval region defined by perimeter 1510, a set of rings (1520) is produced. Compared to rastering the beam in a serpentine fashion (1530), this technique simplifies the transition between spot-sizes without altering the exposure dose in the critical dose region (321) and can produce a more uniform dose profile in non-critical regions. One of the advantages of representing the part in solid modeling software is all the individual laser beam traces can be rapidly generated from standard operations. The algorithm shown in the flow-chart in FIG. 16 outlines the procedure for defining a new contour offset from the perimeter of an individual layer a specified distance. It is a modified version of the OFFSET command in AutoCAD, but generalized to arbitrary geometries which have internal sections removed.

Figure 17A:
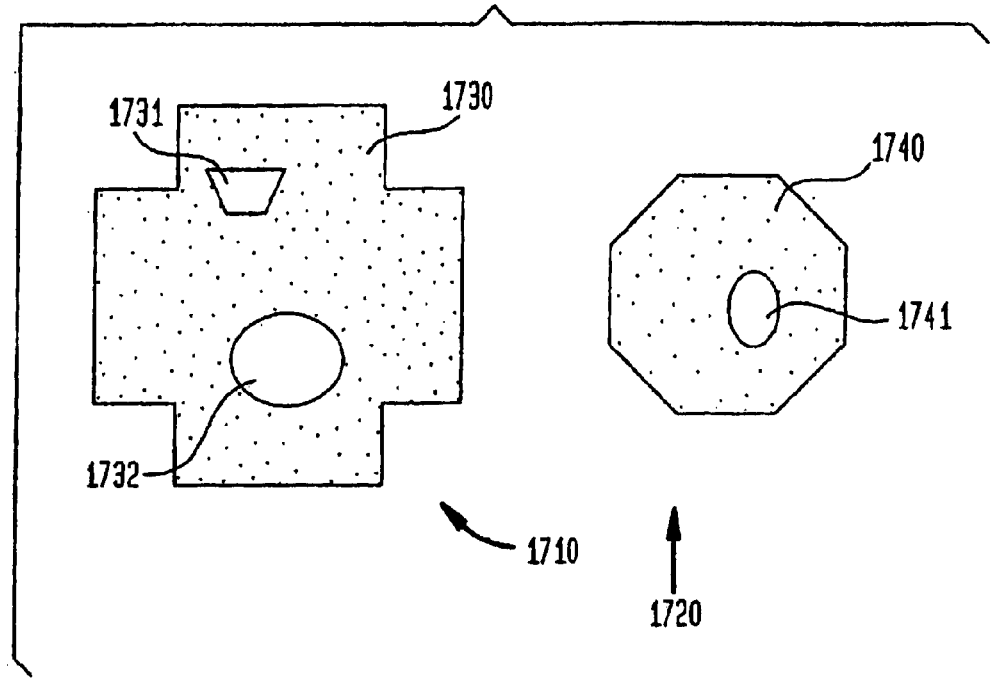
FIG. 17A is a schematic representation of a generic layer comprised of two discrete regions.
Figure 17B:
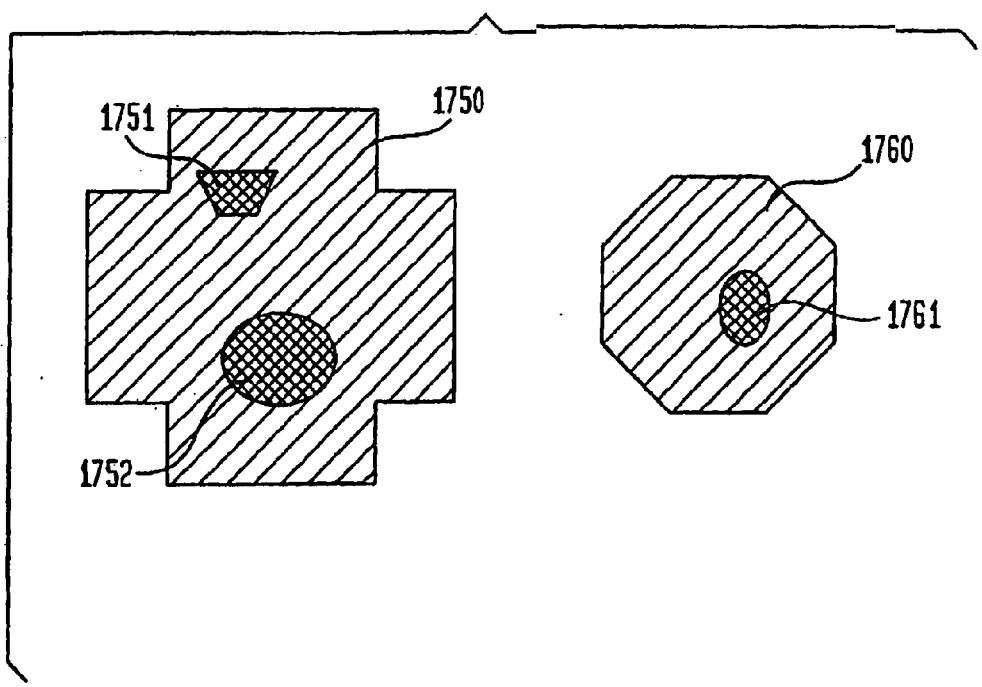
FIG. 17B is a schematic representation of individuals region associated with edges.
Figure 18A:
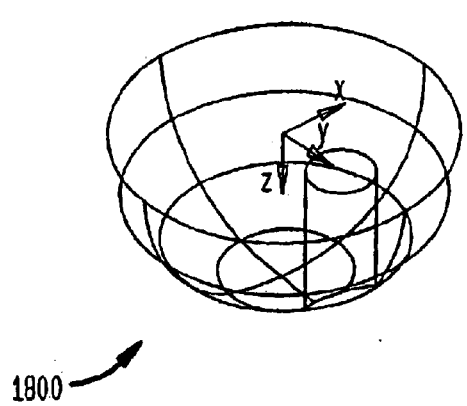
FIG. 18A is a depiction of a generic structure illustrating the spot-size modulation of the invention.
Figure 18B:
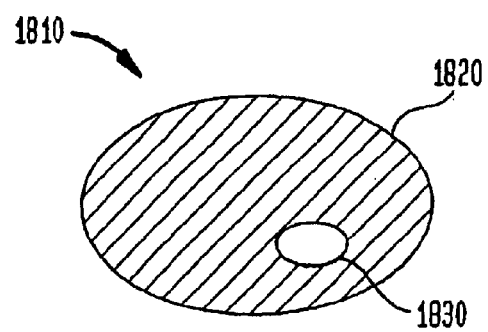
FIG. 18B is a depiction of a structure cut at z=25 micrometers below the surface using the section command in AutoCAD®.
Figure 18C:
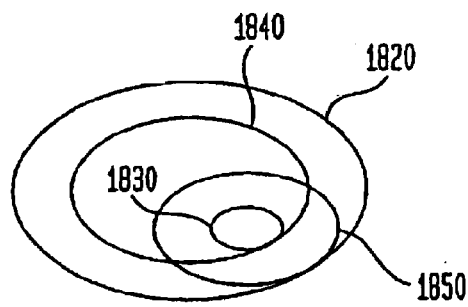
FIG. 18C is a depiction of an individual region defined by an offset edge.
Figure 18D:
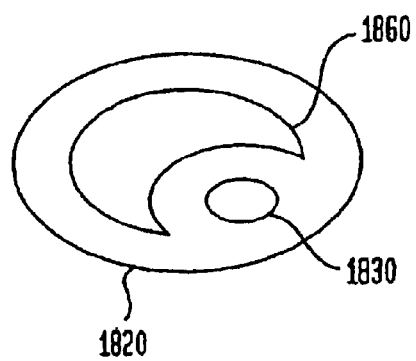
FIG. 18D is a depiction of the resultant contour offset from both outer and inner edges.

The procedure for defining an offset perimeter is as follows. An individual layer of a structure can be generated by intersecting a plane with the structure (step 1610). In AutoCAD, this is performed using the SECTION command. A list of discrete regions for the layer must first be determined. It can be generated by first creating a list of all perimeter locations of the structure (step 1620). In AutoCAD, the EXPLODE command can be used to convert a region into a set of closed polyline entities describing the perimeter, which will be referred to as the edges of the structure. A new set of regions can be associated with each individual edge. In AutoCAD, this can be performed using the REGION command. (The original structure is not produced since the Boolean operations that were used to create the structure from the individual regions has not been performed.) Each discrete region (step 1630) in the original structure can be determined by performing a Boolean comparison between each newly defined region and the original section. Any newly defined region which intersects the original region produced by the SECTION command contains the outer edge of a discrete region. Each remaining region is compared with the previous set of regions which define outer edges, and if it intersects, its border defines an inner perimeter for that discrete region. In AutoCAD, the Boolean INTERSECTION operation will return a NULL pointer indicating no intersection otherwise exists. For instance, shown in FIG. 17a is a generic layer of a structure comprised of two discrete regions, 1710 and 1720. Associated with this layer is five edges: 1730, 1731, 1732, 1740 and 1741. Each edge outlines a new region as shown in FIG. 17b. Regions 1750 and 1760 intersect the original layer and thus define the outer perimeter of discrete regions. Regions 1751 and 1752 intersect region 1750 and thus their edges define the inner perimeter of the discrete region outlined by edge 1730. In a similar fashion, the edges of region 1761 define an inner edge for the region outlined by edge 1740. Discrete regions can be reconstructed by subtracting regions defined by inner perimeters from the region defined by the corresponding outer perimeter. For each discrete region, the following steps are performed to define the locus of points offset from the perimeter by a specified distance. To illustrate the procedure, the steps are performed on the generic structure of a hemisphere of radius 250 μm with a cylindric region removed from a portion of the interior as shown in FIG. 18a. FIG. 18b shows a layer (1810) cut from the structure (1800) 25 μm below the surface using the SECTION command (step 1610). By following the previous steps to identify each discrete region (steps 1620 and 1630), a list of all edges including specification of outer (1820) and inner (1830) edges is created. A new set of edges is then generated, each offset from the perimeter by the specified distance towards the interior of the part (step 1640). In FIG. 18c, 1840 is the offset outer edge 1820 while 1850 is the offset inner edge 1830. In AutoCAD, the OFFSET command and IN_SOLID command can be used to create the new set of edges and choose the appropriate side of the edge to offset on. A new region is then defined (step 1650) by performing a Boolean subtraction of the region defined by the union of all the offset inner edges (1830) from the region defined by the offset outer edge (1840). This operation in effect trims intersecting offset edges as shown in FIG. 18d. The resulting list of closed edges (in this case 1860) defines the locus of points offset from the perimeter of the discrete region by a fixed amount (step 1660). In AutoCAD, each edge can be approximated by a polyline (step 1670). As such, the procedure can be used to provide the vector scan mapping of each laser beam trace (step 1360).

Initially, the critical dose region is patterned using the highest resolution beam (i.e. smallest spot-size) starting from the perimeter of the part. The laser beam is then incrementally moved inwards. The incremental spacing between laser beam scans is determined by the acceptable tolerances in dose uniformity. As explained earlier, the incremental spacing between traces are typically on the order of the spot-size radius. The beam is continually stepped inwards until the entire critical dose area (321) is covered using the algorithm summarized in the flow-chart of FIG. 16 to define each trace. The entire critical dose region is covered when the region defined by the edges of the most recent trace does not intersect the critical dose region as defined in equation 12.

The highest resolution beam is used to pattern an additional transitional zone (322) to enable larger spot sizes to be used to pattern interior portions without modifying the dose in the critical dose region. The actual width of each subsequent band (step 1350) is dependent upon the actual intensity distribution of the focussed exposure source and incremental line spacing between traces. For a Gaussian intensity distribution, within approximately 2 beam radii from the center of the beam, the intensity has fallen by a factor of Exp[−2 (2)²]=0.0003. As a general rule, therefore, defining the thickness of the transitional zone as at least approximately 2 times the spot radius of the next lowest resolution provides a suitably large buffer zone (assuming the incremental line spacing between scans is on the order of the spot radii used). The following formula can be used as a simple design rule for the width of the transitional zone (322), $w_1$, patterned at the highest resolution:

$$w_i = 2\Delta_{min} + \text{CEILING}(2 * r_2 / \Delta^{min}) \tag{13.a}$$

The width extends from the last trace in the critical dose region to the last trace in the first transitional region. The function, CEILING(x), returns the smallest integer greater than or equal to x. The first term on the right hand side of the equation is used in case the dose in the transitional region (322) varies significantly from the dose in the critical region (321). This spacing in effect provides a buffer area within the transitional zone to produce a smoother energy intensity distribution between the critical (321) and transitional (322) zones. The exposure dose used for these scans should be the same dose as used in the critical zone. The second term provides the buffer area within the transitional zone for the next largest spot-radii used in the next band. The total number of scans in the transitional zone patterned at the highest resolution is equal to:

$$\#\text{scans}_i = 2 + \text{CEILING}(2 * r_2 / \Delta_{min}) = 2 + \text{CEILING}(2 * r^{min} / \Delta_{min} \cdot r_2 / r_{min}) \tag{13.b}$$

Subsequent traces in intermediate lower resolution zones, (330 and 340) are patterned in a similar fashion. As a simple design rule, the width of each subsequent band, $w_i$, is:

$$w_i = \text{CEILING}(2 * r_{i+1} / \Delta_i) * \Delta_i \text{ for } i=\{2,3,4,\ldots m\} \tag{14.a}$$

where m is calculated in equation 10. The total number of scans for each band is equal to:

$$\#\text{scans}_i = \text{CEILING}(2 * r_{i+1} / \Delta_i) = \text{CEILING}(2 * r_i / \Delta_i \cdot r_{i+1} / r_i) \tag{14.b}$$

Figure 19A:
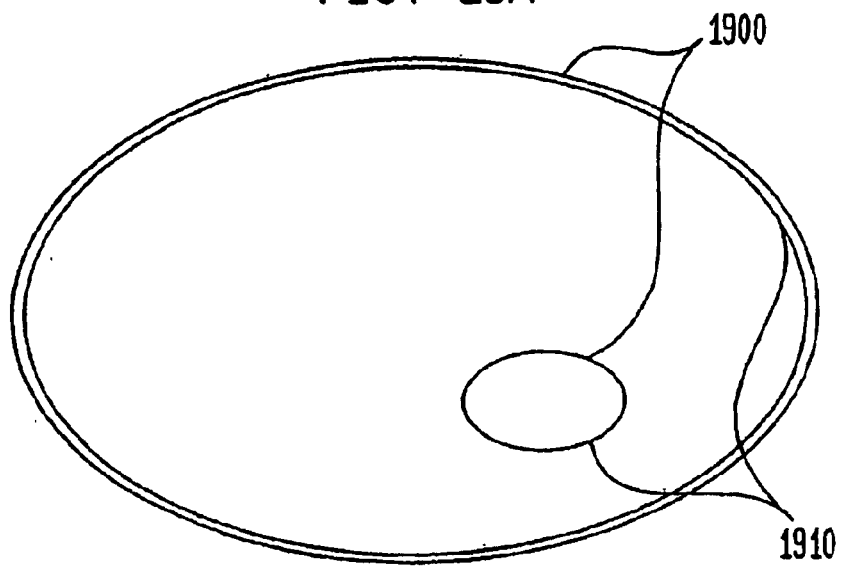
FIG. 19A depicts sections of two distinct layers from the structure of FIG. 18 translated to the same plane.
Figure 19B:
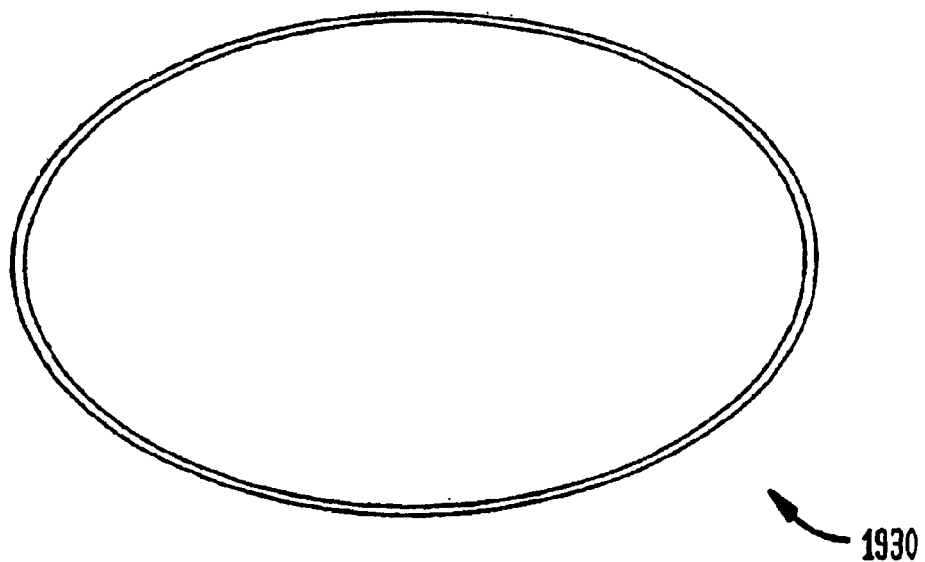
FIG. 19B depicts a critical dose region defined by subtraction of the underlayer from the overlayer.
Figure 19C:
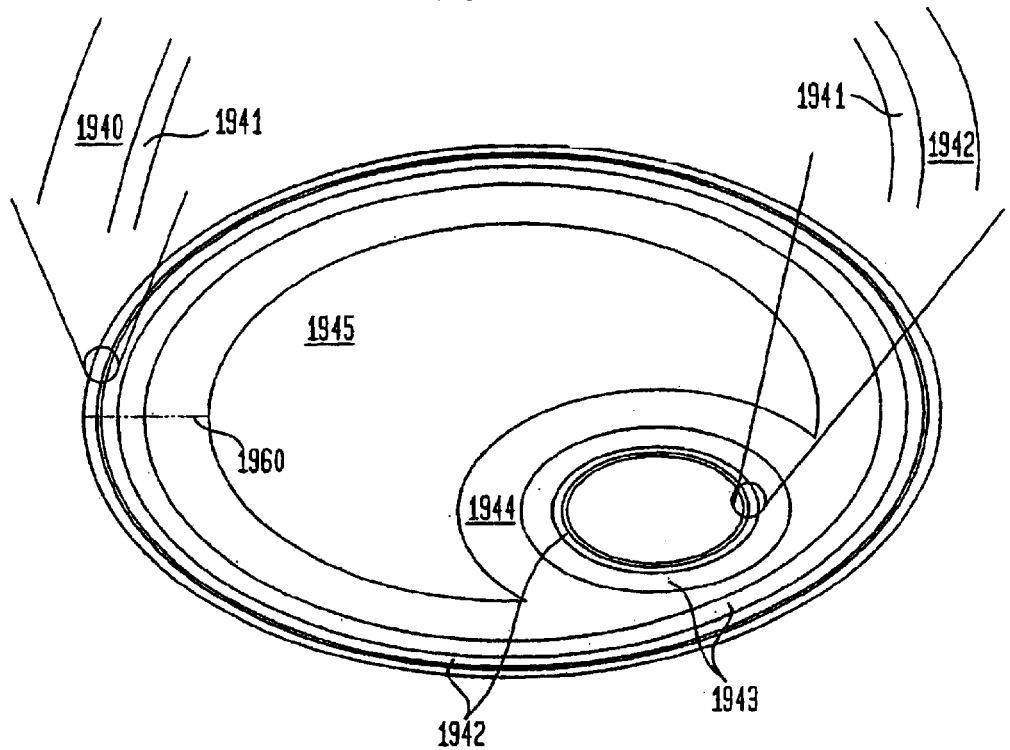
FIG. 19C depicts the critical dose region and intermediate zones for a layer in FIG. 18.
Figure 19D:
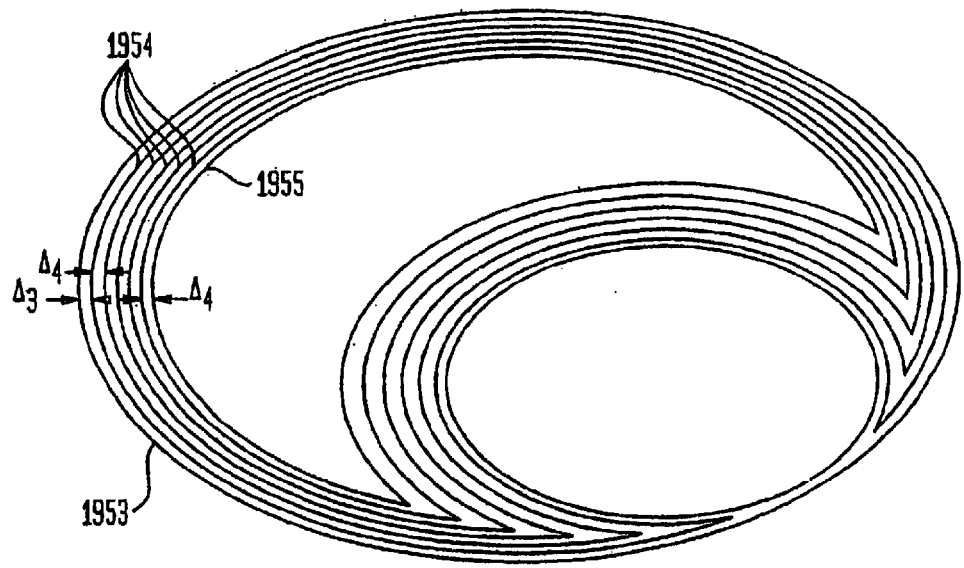
FIG. 19D depicts individual line scans for the intermediate zone 1944.

The first trace in the band begins a distance $\Delta_{i+1}$ from the last trace in the previous band. Intermediate zones are continually defined until the entire discrete region is covered or all intermediate spot sizes have been used and a controlled transition to the lowest resolution beam has been achieved. In the former case, the remaining coarse zone is patterned at the lowest resolution again following the contour of the part incrementally moving inwards after each encirclement. The first of these traces again begins offset from the last trace in the previous band by a distance $\Delta_m$. FIGS. 19a and 19b show the construction of the various zones for layer 1810 using the spot radii listed in equation 11 and assuming the incremental line spacing between scans is equal to the current spot-radius used to pattern the band (i.e. $r_i / \Delta_i = 1$). FIGS. 19a and 19b show the construction of the critical dose region. For illustration purposes, 1910 denotes the edges of the layer below the current layer in which negligible light leakage occurs. The edges of the current layer are represented by 1900. The critical dose region is formed by subtracting the region of the underlayer (defined by edge 1910) from the current layer (defined by edge 1900) resulting in the ring structure 1930. FIG. 19c shows the critical dose region (1940), transitional region patterned at high resolution (1941), and intermediate regions 1942, 1943, 1944, and 1945 patterned at increasing spot radii using the modified version of the offset command outlined in FIG. 16 and equations 13 and 14 to define the width of each band. In this case, no portion is patterned at the coarsest resolution since the entire area has been covered. FIG. 19d shows the individual laser traces (1954) in zone 1944. The last trace from region 1943, 1953, and the first trace in region 1945, 1955 is also shown.

Figure 20A:
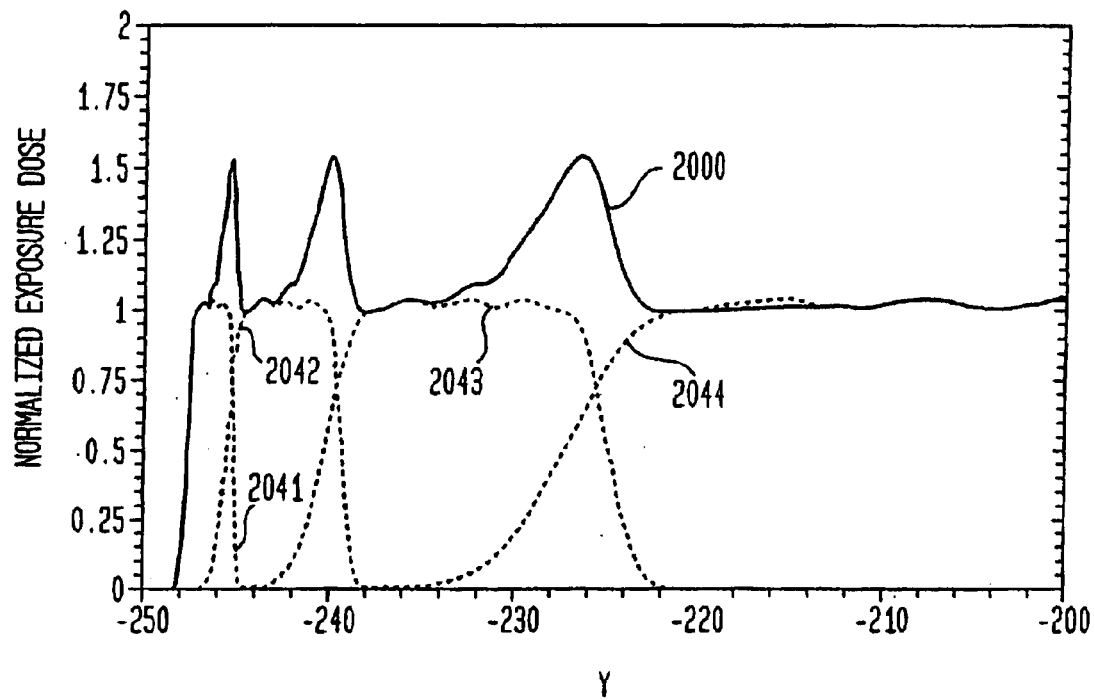
FIG. 20A is a graphical representation for the dose distribution in intermediate buffer zones 1941 through 1944 using constant laser power for each laser scan.
Figure 20B:
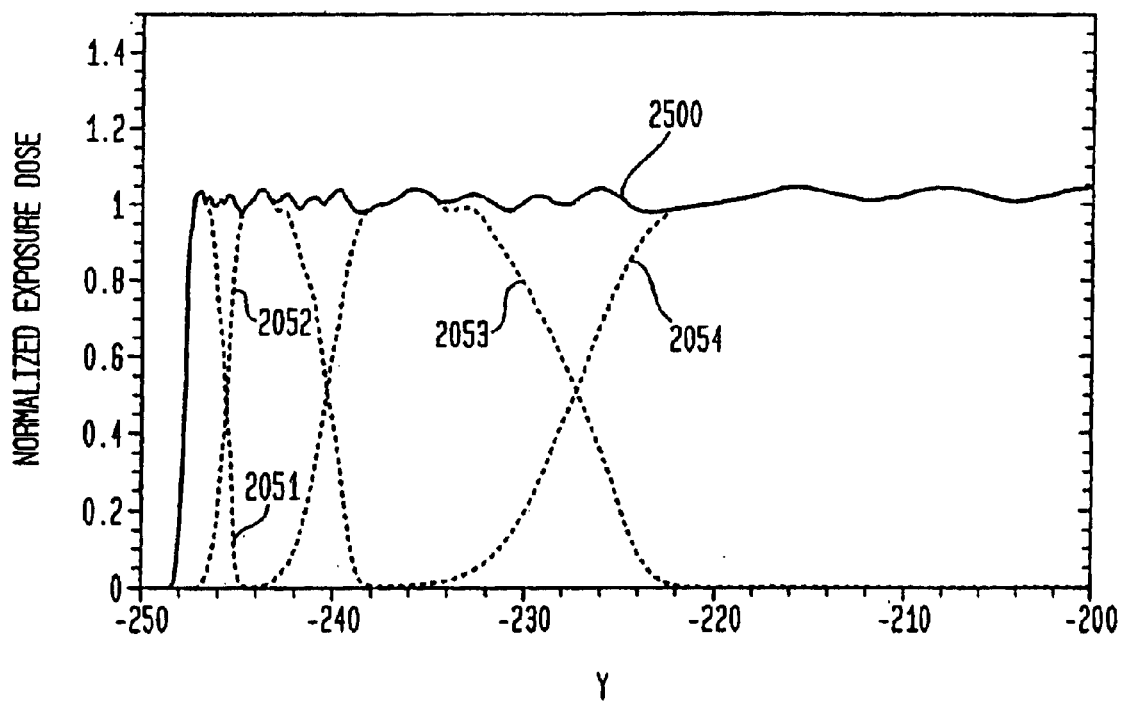
FIG. 20B is a graphical representation of dose distribution in intermediate buffer zones 1941 through 1944 using variable laser power for each laser scan.

The laser beam trace can be computed from an approximated 2D polyline fit for each offset perimeter (step 1670). In AutoCAD for instance, this is a standard feature. The density of points can also be controlled. In this manner, the vertices can be fed to the scanner controller module as a pair of x,y values. The rate at which the values are read out and the distance between points determines the scanning velocity. The required dose at each point is calculated using the procedure in the dose modulation algorithm. The power level required to deliver this dose is a function of the spot size, scanning velocity, and incremental line spacing. In the critical dose region and course zone region, equation 8 can be used to calculate the required power. In intermediate buffer zones however where different spot sizes are used in close proximity, light penetration between zones must be accounted for. For instance, FIG. 20a shows the calculated normalized exposure dose distribution (2000) along the path 1960 through zones 1941, 1942, 1943, and 1944 if a constant laser power density were used on each line scan using a slightly modified version of equation 6 which incorporates different spot diameters in the summation term for the case $r_i/\Delta_i=1$. The individual exposure doses used in the transitional zone (1941), intermediate zones (1942, 1943, and 1944) are also shown as traces 2041, 2042, 2043, and 2044 respectively using the spot radii listed in equation 11. Dose spikes would occur between scans. However by adjusting the laser power density used on each trace, the dose uniformity can be significantly improved. Since the transition and intermediate zones are sufficiently wide that only the penetration of the next largest spot-size must be considered, it is relatively straightforward to compensate for this extra dose. Basically, the exposure dose from patterning the interior section at the coarsest resolution is calculated using equation 6 at the center of the beam for each trace in the adjoining intermediate buffer region. The power density levels of each trace in this intermediate buffer region are reduced by the calculated value to compensate for the light penetration. This produces a more uniform profile in the last intermediate zone. The same process can be continued on the next intermediate zone. Shown in FIG. 20b are the new more uniform dose distribution (trace 2500) which occurs in the same zones (1941, 1942, 1943, and 1944) along with the normalized exposure doses in each zone (2051, 2052, 2053, and 2054) for the case $r_i/\Delta_i=1$.

The algorithm presented for spot-size modulation significantly reduces the total patterning time compared to scanning the entire region at the highest resolution. For instance, for layer 1810, the total scanning time is approximately several seconds assuming the subdivision widths and spot-sizes shown in the equation 11 are used and the scanning velocity of the laser beam is 3 cm/s. If the entire structure were scanned at 1 $\mu$m resolution, the total time would be over 10 times longer. The above description serves as a general guideline for modulating the spot size to improve throughputs without degrading resolution or dose control. Error tolerances can be relaxed or made more stringent altering the total widths of each of the bands. Additional measures can be added to improve throughputs or achieve finer resolutions and better dose uniformity. In instances where the radius of curvature is on the order of the spot size, methods in laser based mask writing systems have been developed for adding serifs to produce sharper edge profiles at corners. These optical proximity correction techniques could similarly be applied here. Also, in the course zone, the beam will overlap itself on an individual trace when the remaining area to be patterned is smaller than the spot-size of the laser beam. Although the dose uniformity in non-critical regions does not have to be strictly controlled as long as development proceeds rapidly through the interior portion, a similar procedure used to transition from small to large spots can be applied in reverse to produce a more uniform total exposure dose over the course zone. For instance, bands could be generated for the coarse zone which has had an infintesimally small region subtracted from it at its center of mass. This prevents dose spikes possibly limiting the total number of layers which must be skipped in defining the critical region. Similar procedures can be applied on an intermediate zone if no coarse zone exists for the layer. For positive tone resists, a further simplification can be made. The entire interior does not have to be patterned. If the perimeter is patterned with a sufficiently thick shell to allow efficient transport of developer, the interior portion of the part will be released during development. This is a similar procedure to laser cutting techniques which utilize multiple beams impinging at oblique angles on a workpiece. A volume of material is removed defined by the facets cut from each laser beam. For certain geometries, such as ones with high width to height ratios, portions of the interior can be patterned to provide conduits for the developer to the bottom of the structure to minimize mass transport restrictions.

Those skilled in the art will know, or be able to ascertain, using no more than routine experimentation, many equivalents to the specific embodiments of the invention described herein. These and all other equivalents are intended to be encompassed by the following claims. All publications and references cited herein including those in the background section are expressly incorporated herein by reference in their entirety.

What is claimed is:

1. A method for modulating radiation exposure of a multi-layer resist, comprising:

predefining a desired pattern of exposed and unexposed regions in different layers of a multi-layer resist;

setting a maximum spot size to be used to pattern the resist where a large exposure area will not impact a critical region of the pattern;

setting a minimum spot size to be used to pattern at least one critical region;

setting at least one intermediate spot size to be used in a buffer region;

patterning the multilayer resist by repeatedly depositing layers and exposing portions of each layer to radiation; and varying the size of a radiation beam over at least one layer of the multi-layer resist using the maximum spot size, the minimum spot size, and the at least one intermediate spot size.

2. The method of claim 1 wherein the interior of a layer is patterned at a larger spot size relative to perimeter portions of the region which are patterned with smaller sized spots of radiation.

3. The method claim 1, wherein the radiation beam is applied to a positive resist.

4. The method of claim 1, wherein the maximum spot size is determined by calculating the functional dependency of exposure dose in proportion to laser power and intensity distribution, scanning velocity, and incremental line-spacing between laser scans.

5. The method of claim 1, wherein a sequence of different spot sizes are determined for patterning each discrete region on a layer.

6. A method for patterning a multilayer resist, comprising the steps of:
   depositing a first layer of resist material onto a substrate;
   scanning a beam of radiation to form a moving spot on the first layer and thereby exposing a portion of the first layer of resist material to the moving spot at a defined scanning speed;
   depositing a second layer of resist material; and
   scanning a beam of radiation to expose a portion of the second layer of resist material to radiation; and
   varying the spot size of the radiation scanned in at least one region of the second layer without changing the scanning speed.

7. The method of claim 6 wherein the steps are repeated until a pattern having greater than two layers has been completed.

8. The method of claim 6 wherein the method further comprises treating the layers with a developing solution to remove the exposed portions of resist when resist is a positive resist or remove the unexposed portions of resist when the resist is a negative resist.

9. The method of claim 6, wherein the method further comprises heating the resist following at least one exposure step.

10. The method of claim 6, wherein the resist material is a positive resist.

11. The method of claim 6, wherein the resist material is a novolac resin.

12. A method for modulating radiation exposure of a multi-layer resist, comprising:
   predefining a desired pattern of exposed and unexposed regions in different layers of a multi-layer resist;
   patterning the multilayer resist by repeatedly depositing layers and exposing portions of each layer to radiation; and
   varying the size of a radiation beam over at least one layer of the multi-layer resist,
   wherein the interior of a layer is patterned at a larger spot size relative to perimeter portions of the region which are patterned with decreasing sized spots of radiation.

13. A method for modulating radiation exposure of a multi-layer resist, comprising:
   predefining a desired pattern of exposed and unexposed regions in different layers of a multi-layer resist;
   patterning the multilayer resist by repeatedly depositing layers and exposing portions of each layer to radiation; and
   varying the size of a radiation beam over at least one layer of the multi-layer resist such that a different spot size is used in each of a critical region, a buffer region, and an interior region.

14. The method of claim 13, wherein the buffer region is patterned with a spot size larger than the spot size used in the critical region and smaller than the spot size used in the interior region.

15. The method of claim 14, wherein the interior region is patterned with a maximum spot size.

16. The method of claim 14, wherein the interior region is spaced at least two times the spot radii of the radiation beam used in the interior region from the inner edge of the critical region.

17. The method of claim 16, wherein the buffer region is subdivided into multiple bands and the multiple bands are patterned at different spot sizes.

18. The method of claim 14, wherein the buffer region has a width of approximately two times the spot radii used in the adjacent interior region.

19. The method of claim 1, wherein the scanning velocity of the radiation beam is constant over the at least one layer.

20. The method of claim 1, wherein the radiation beam has a Gaussian energy profile.

21. The method of claim 1, wherein the radiation beam has a Airy disk profile.

22. A method for modulating exposure of a multi-layer resist to a beam of radiation having a non-uniform lateral energy distribution, comprising:
   predefining a desired pattern of exposed and unexposed regions in different layers of a multi-layer resist;
   establishing a desired scanning speed for a moving spot of radiation to expose the resist according to the pattern;
   determining a maximum spot size allowable for exposing regions of the pattern without reducing the scanning speed;
   determining at least one smaller spot size needed to expose a buffer region of the pattern;
   establishing a buffer region in which the smaller spot size will be employed to buffer a critical region;
   patterning the multilayer resist by repeatedly depositing layers and exposing portions of each layer to a moving spot of radiation while varying the size of the spot over a particular layer of the multi-layer resist; wherein the buffer region is patterned with a spot size larger than a spot size used in a critical region and smaller than the maximum spot size used in an interior region.

23. The method of claim 22, wherein the interior region is spaced at least two times the spot radaii of the radiation beam used in the interior region from the inner edge of the critical region.

24. The method of claim 22, wherein the buffer region has a width of approximately two times the spot radii used in the adjacent interior region.

25. The method of claim 22, wherein the buffer region is subdivided into multiple bands and the multiple bands are patterned at different spot sizes.

* * * * *